United States Patent
Lai et al.

(10) Patent No.: US 12,057,363 B2
(45) Date of Patent: Aug. 6, 2024

(54) CHIP PACKAGE STRUCTURE WITH MULTIPLE GAP-FILLING LAYERS AND FABRICATING METHOD THEREOF

(71) Applicant: Taiwan Semiconductor Manufacturing Company, Ltd., Hsinchu (TW)

(72) Inventors: Po-Chen Lai, Hsinchu county (TW); Ming-Chih Yew, Hsinchu (TW); Po-Yao Lin, Zhudong Township, Hsinchu County (TW); Chin-Hua Wang, New Taipei (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/462,458

(22) Filed: Aug. 31, 2021

(65) Prior Publication Data

US 2023/0060756 A1  Mar. 2, 2023

(51) Int. Cl.
  *H01L 23/31* (2006.01)
  *H01L 21/56* (2006.01)
  (Continued)

(52) U.S. Cl.
  CPC ........ *H01L 23/3185* (2013.01); *H01L 21/565* (2013.01); *H01L 23/145* (2013.01);
  (Continued)

(58) Field of Classification Search
  CPC .. H01L 23/31; H01L 23/3185; H01L 23/3192
  See application file for complete search history.

(56) References Cited

U.S. PATENT DOCUMENTS

| 2012/0119354 A1* | 5/2012 | Tsai | ..................... H01L 23/562 257/737 |
| 2021/0036859 A1 | 2/2021 | Mehta et al. | |

(Continued)

FOREIGN PATENT DOCUMENTS

| TW | 202017064 A | 5/2020 |
| WO | WO-2017216918 A1 * | 12/2017 |
| WO | WO-2021081943 A1 * | 5/2021 |

OTHER PUBLICATIONS

Le Bourhis, "Glass, Mechanics and Technology": Wiley, 2007, pp. 271-274. (Retrieved from https://onlinelibrary.wiley.com/doi/pdf/10.1002/9783527617029.app3) (Year: 2007).*

*Primary Examiner* — Michele Fan
(74) *Attorney, Agent, or Firm* — Birch, Stewart, Kolasch & Birch, LLP

(57) ABSTRACT

Structures and formation methods of a chip package structure are provided. The chip package structure includes an interposer substrate including first and second die regions that are separated by a gap region. The chip package structure also includes first and second semiconductor dies respectively arranged over the first and second die regions. In addition, the chip package structure includes first and second gap-filling layers formed over the gap region and separated from one another, and a third gap-filling layer over the gap region and between the first and second gap-filling layers. The Young's modulus of the third gap-filling layer is less than the Young's modulus of the first gap-filling layer and the Young's modulus of the second gap-filling layer.

20 Claims, 20 Drawing Sheets

(51) Int. Cl.
*H01L 23/00* (2006.01)
*H01L 23/14* (2006.01)
*H01L 23/29* (2006.01)
*H01L 23/498* (2006.01)
*H01L 25/065* (2023.01)

(52) U.S. Cl.
CPC ........ *H01L 23/293* (2013.01); *H01L 23/3192* (2013.01); *H01L 23/49811* (2013.01); *H01L 23/49822* (2013.01); *H01L 23/49833* (2013.01); *H01L 23/49838* (2013.01); *H01L 24/32* (2013.01); *H01L 24/73* (2013.01); *H01L 25/0655* (2013.01); *H01L 2224/32056* (2013.01); *H01L 2224/32059* (2013.01); *H01L 2224/32225* (2013.01); *H01L 2224/73204* (2013.01); *H01L 2924/1431* (2013.01); *H01L 2924/1434* (2013.01); *H01L 2924/1811* (2013.01); *H01L 2924/1815* (2013.01); *H01L 2924/182* (2013.01); *H01L 2924/186* (2013.01); *H01L 2924/35121* (2013.01)

(56) References Cited

U.S. PATENT DOCUMENTS

| | | |
|---|---|---|
| 2021/0074603 A1 | 3/2021 | Chang et al. |
| 2021/0193542 A1 | 6/2021 | Chang et al. |
| 2022/0189907 A1* | 6/2022 | Nam .................. H01L 23/3135 |
| 2022/0328445 A1* | 10/2022 | Yu ........................... H01L 24/96 |

\* cited by examiner

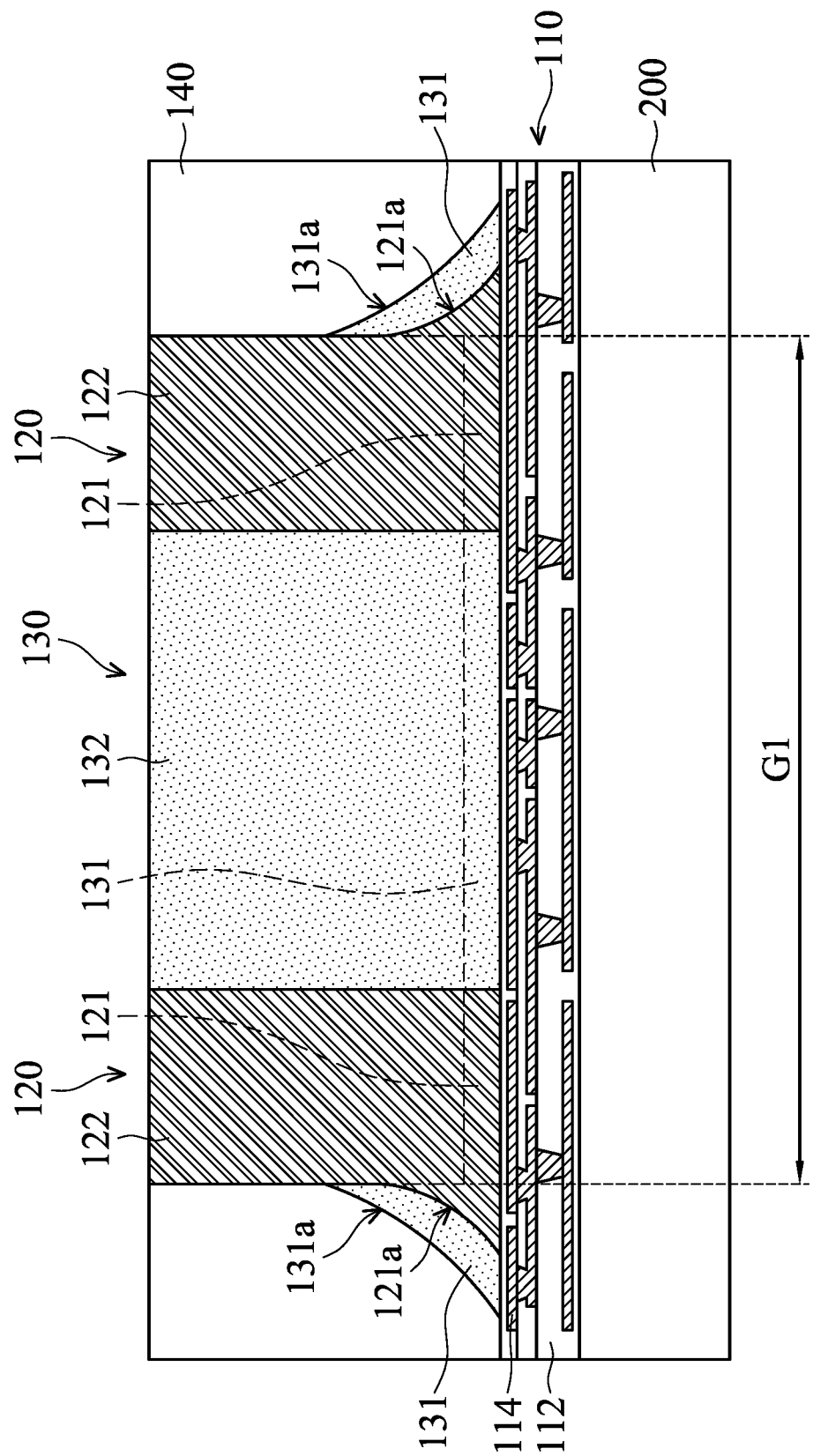

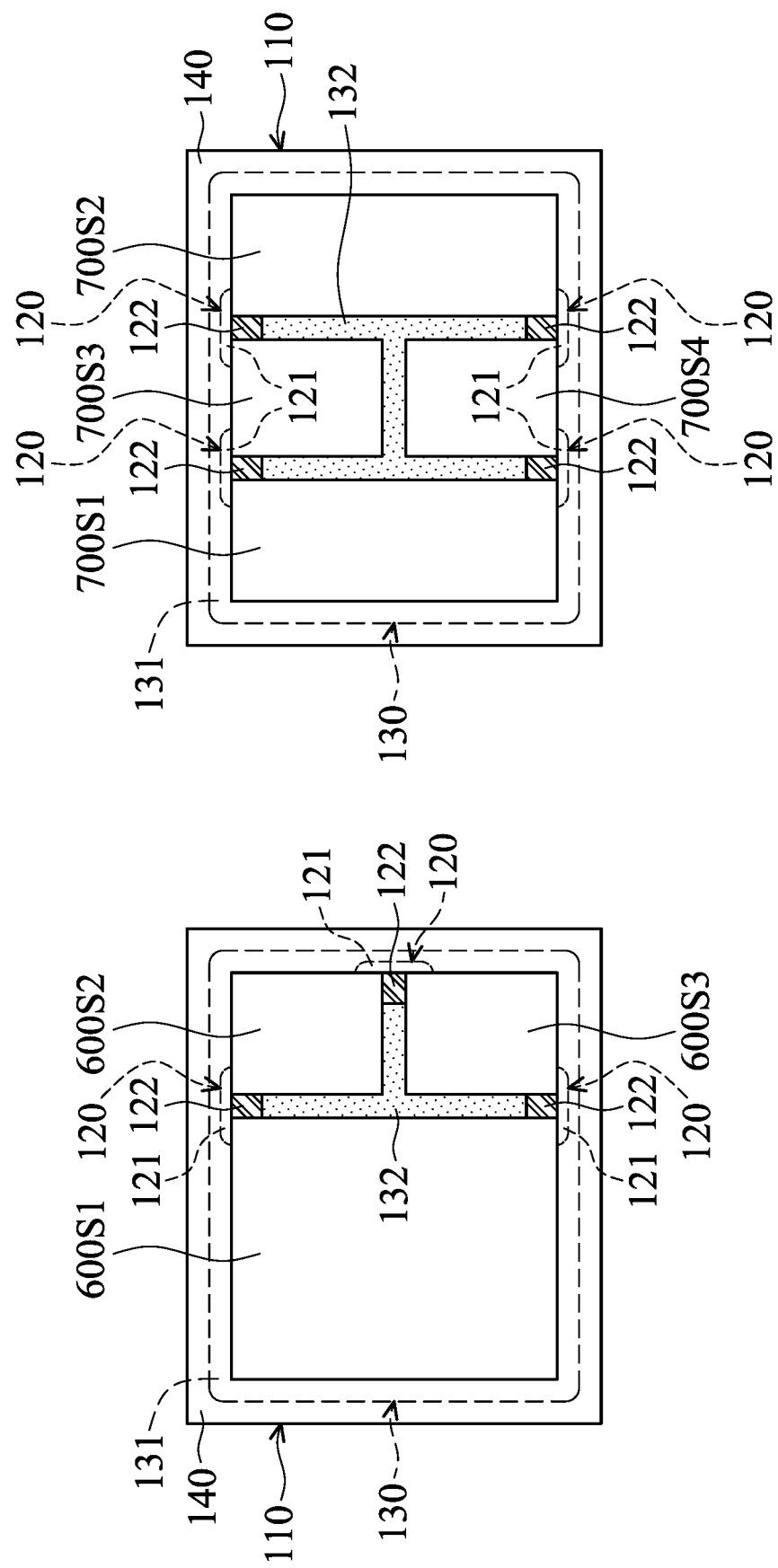

CHIP PACKAGE STRUCTURE WITH MULTIPLE GAP-FILLING LAYERS AND FABRICATING METHOD THEREOF

BACKGROUND

Semiconductor devices and integrated circuits are typically manufactured on a single semiconductor wafer. The semiconductor dies of the wafer may be processed and packaged with other semiconductor devices or dies at the wafer level, and various technologies have been developed for the wafer level packaging.

Those individual semiconductor dies are formed by sawing the integrated circuits along scribe lines of the semiconductor wafer. The individual semiconductor dies are then packaged separately. The semiconductor packages may further connected to circuit substrates by, for example, a flip bonding technology. As those semiconductor packages are mounted onto the circuit substrates and protected with underfills and/or molding compounds, the reliability of the protective layer(s) becomes important and crucial.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-3C respectively show cross-sectional views along B-B' line shown in FIGS. 2A-2C, in accordance with some embodiments.

FIG. 3A-1 shows a cross-sectional view along B-B' line shown in FIG. 2A, in accordance with some embodiments.

FIG. 3A-2 shows a cross-sectional view along B-B' line shown in FIG. 2A, in accordance with some embodiments.

FIG. 6 is a plan view of an arrangement of semiconductor dies in a chip package structure, in accordance with some embodiments.

FIG. 7 is a plan view of an arrangement of semiconductor dies in a chip package structure, in accordance with some embodiments.

DETAILED DESCRIPTION

Figure 1A:
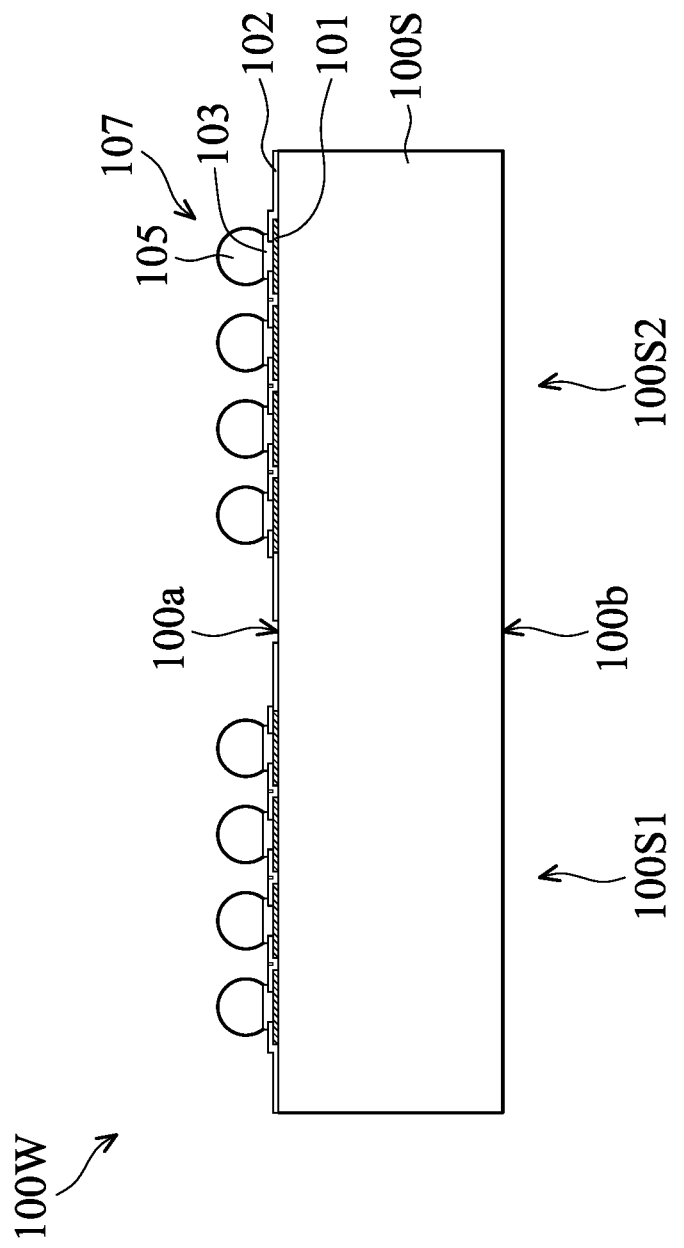
FIGS. 1A-1I are cross-sectional views of various stages of a process for forming a chip package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. FIGS. 1A-1I are cross-sectional views of various stages of a process for forming a chip package structure, in accordance with some embodiments. Additional operations can be provided before, during, and/or after the stages described in FIGS. 1A to 1I. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, a semiconductor wafer 100W is provided. The semiconductor wafer 100W includes semiconductor chips (which are also referred to as semiconductor dies when sawed apart). In order to simplify the diagram, only two adjacent semiconductor chips/dies 100S1 and 100S2 are depicted. In some embodiments, the semiconductor chip/die provides logic functions for the structures. For example, the semiconductor chip/die 100 is a system-on-chip (SoC) chip (e.g., a central processing unit (CPU) die, a graphics processing unit (GPU) die, a mobile application die, a micro control unit (MCU) die, an application processor (AP) die) or a memory die (e.g., a high-bandwidth memory (HBM) die or a static random access memory (SRAM) die), although any suitable semiconductor chip/die may be utilized.

The semiconductor wafer 100W may include a semiconductor substrate 100S. The semiconductor substrate 100S may include bulk silicon, doped or undoped, or an active layer of a silicon-on-insulator (SOI) substrate. Generally, an SOI substrate includes a layer of a semiconductor material such as silicon, germanium, silicon germanium, or combinations thereof. The semiconductor substrate 100S may include integrated circuit devices (not shown) and an interconnect structure (not shown). The integrated circuit devices may include active devices (e.g., transistors). The active devices may be formed using any suitable methods either within or else on the semiconductor substrate 100S. In some embodiments, the interconnect structure is formed over the semiconductor substrate 100S and the active devices and are designed to connect the various active devices to form functional circuitry. In some embodiments, the interconnect structure is formed of alternating layers of dielectric and conductive material and may be formed through any suitable process (such as deposition, damascene, dual damascene, etc.). The dielectric layers may include low-k dielectric layers, for example, with k values lower than about 3.0.

In some embodiments, conductive pads 101 are formed at the front surface 100a (which is also referred to as an active surface) of the semiconductor substrate 100S, and are electrically coupled to integrated circuit devices through the interconnect structure. The conductive pads 101 may be bonding pads that made of metals such as aluminum, copper, nickel, gold, and combinations thereof. The conductive pads 101 may be formed using a deposition process, such as sputtering, to form a layer of material and the layer of material may then be patterned via a suitable process (such as lithography and etching) to form the contact pads.

In some embodiments, conductive pillars 103, such as copper pillars, copper alloy pillars, or other suitable metal pillars, are formed on conductive pads 101. The conductive pillars 103 are formed on conductive pads 101. For example, the conductive pillars 103 may be formed by initially placing a photoresist and then patterning the photoresist into the desired pattern for the conductive pillars. A plating process is then utilized to form the conductive material (e.g., copper) in connection with the conductive pads 101. However, any suitable methods may be utilized.

In some embodiments, an insulating protective layer 102 is formed to cover the active surface 100a of the semiconductor substrate 100S and a portion of the conductive pad 102. The material of insulating protective layer 102 may be selected from solder resists, a polymer such as polyimide (PI), polybenzoxazole (PBO), benzocyclobutene (BCB), molding compound, and the like. Alternatively, the material of insulating protective layer 102 may be selected from silicon oxide, silicon oxynitride, silicon nitride, silicon carbide, another suitable material, or a combination thereof.

In some embodiments, the conductive pillar 103 extend above the insulating protective layer 102 from the corresponding conductive pad 101, as shown in FIG. 1A. In some other embodiments, the conductive pillars 103 are embedded in the insulating protective layer 102, so that the top surfaces of the conductive pillars 103 are substantially level with the top surface of the insulating protective layer 102.

In some embodiments, after the conductive pillars 103 are formed, an electrical connector 105 (e.g., microbump) is correspondingly bonded on each of the conductive pillars 103 of the semiconductor wafer 100W. For example, the electrical connectors 105 may be solder balls and formed on the conductive pillars 103 using a ball-mounting head (not shown), as shown in FIG. 1A. The electrical connectors 105 may be made of a material such as tin, silver, lead-free tin, or copper. Each of the conductive pillars 103 and the overlying and corresponding electrical connector 105 form a bump structure 107 that provides an electrical connection between the semiconductor die 100 and an external circuit (not shown).

Figure 1B:
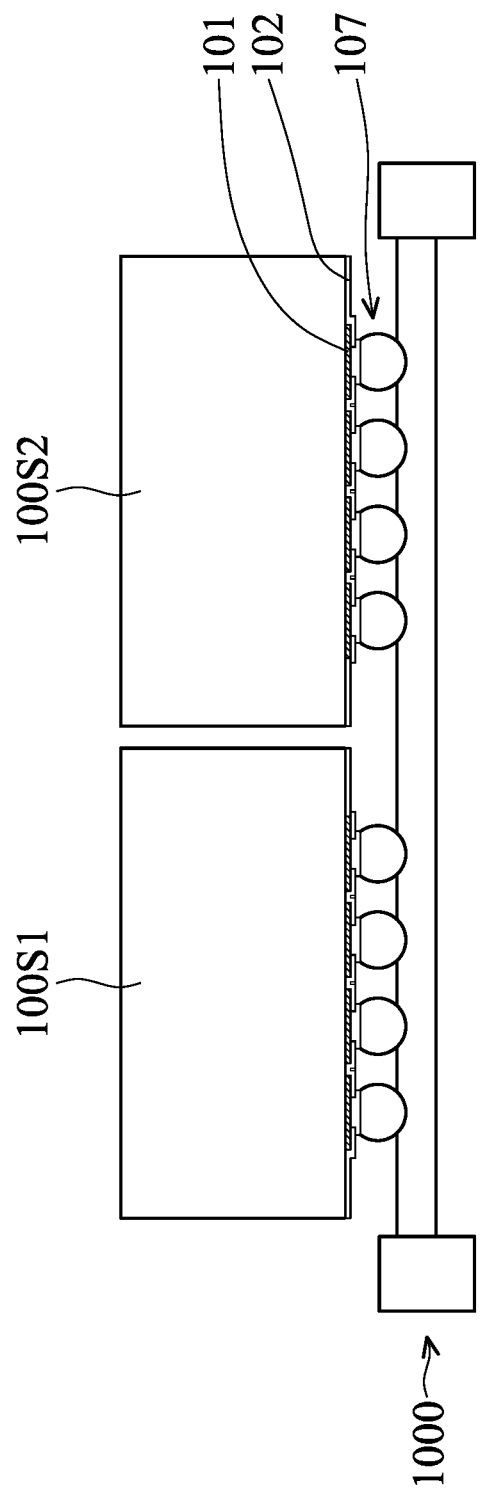

After the bump structures 107 are formed, a singulation process is performed to form semiconductor dies 100S1 and 100S2 are formed, as shown in FIG. 1B, in accordance with some embodiments. As shown in FIG. 1B, the semiconductor wafer 100W is flipped and attached on a carrier substrate 1000 through the bump structures 107, in accordance with some embodiments. The carrier substrate 1000 may include a tape layer which serves as a temporary carrier and is easily detached from the bump structures 107.

Afterwards, the rear surface 100b (which is also referred to as a non-active surface) of semiconductor substrate 100S is diced along the scribe lines (not shown) of the semiconductor substrate 100S by a sawing process, an etching process, or a combination thereof. For example, the rear surface 100b of semiconductor substrate 100S may be diced by a sawing process using one or more blades. After the semiconductor wafer 100W (i.e., the semiconductor substrate 100S) is diced, the semiconductor dies 100S1 and 100S2 are formed and separated from each other.

Figure 1C:
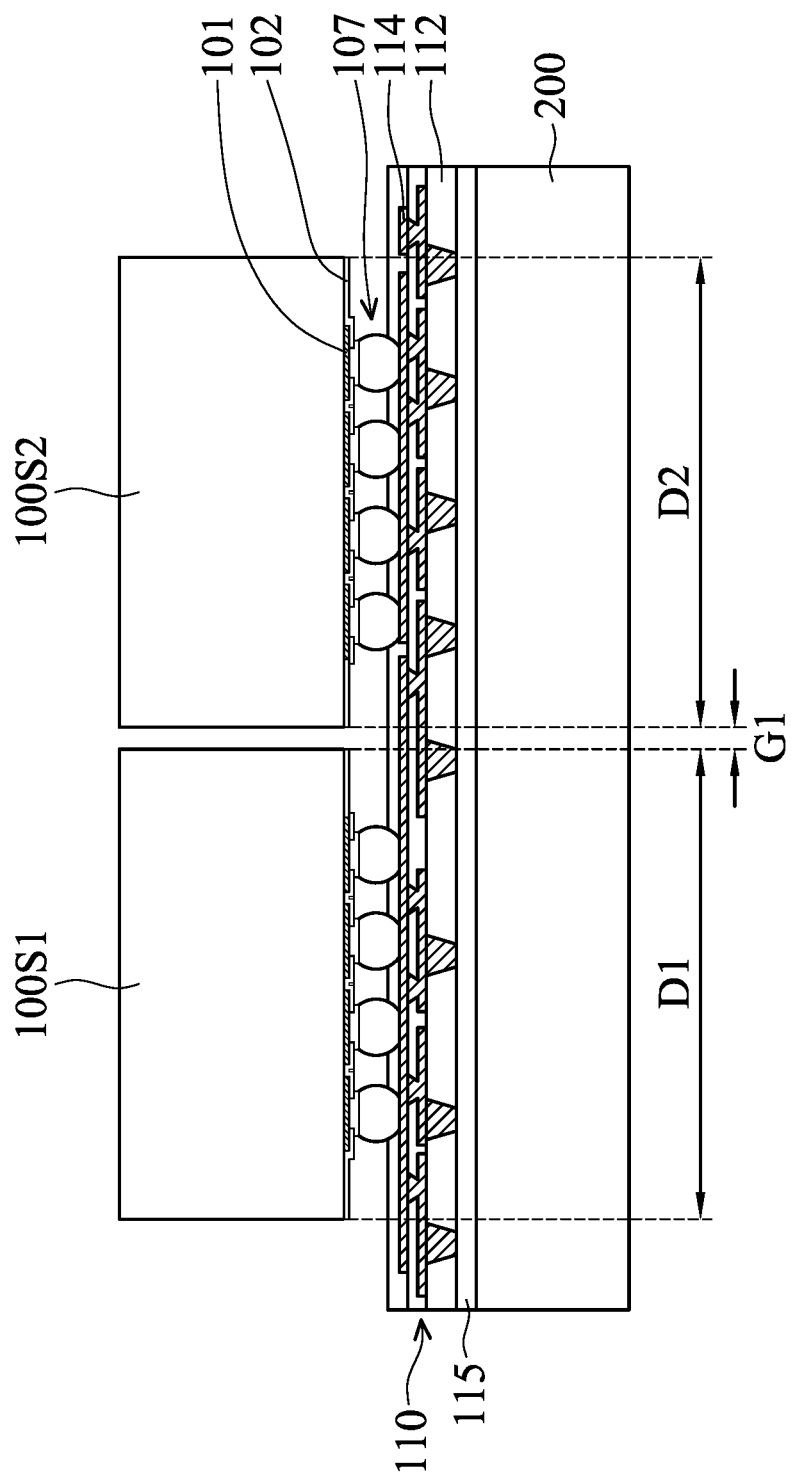

After the singulated semiconductor dies 100S1 and 100S2 are formed, an interposer substrate 110 formed over a carrier substrate 200 is provided and bonded with the interconnect structure of the semiconductor dies (e.g., the semiconductor dies 100S1 and 100S2), as shown in FIG. 1C in accordance with some embodiments. In some embodiments, the carrier substrate 200 includes a de-bonding layer (not shown) coated thereon. The carrier substrate 200 may be a glass carrier substrate, a ceramic carrier substrate or any suitable carrier substrate for carrying a semiconductor wafer for the manufacturing method of the chip package structure. The de-bonding layer may include a light-to-heat conversion (LTHC) layer or an adhesive layer (such as a ultra-violet curable adhesive or a heat curable adhesive layer). The de-bonding layer is decomposable under the heat of light, so as to remove the carrier substrate 200 from the overlying structure (e.g., the interposer substrate 110) in the subsequent steps.

In some embodiments, the interposer substrate 110 includes a redistribution layer (RDL) structure 114 that is formed in an insulating base layer 112 and covered by an insulating protective layer 115 (which may be referred to as a passivation layer) that is attached onto the carrier substrate 200 via the de-bonding layer. The interposer substrate 110 may be used as a fan-out RDL structure for routing. More specifically, the redistribution structure 114 of the interposer substrate 110 includes one or more conductive layers embedded within one or more dielectric layers (which form the insulating base layer 112). The redistribution structure 114 may provide conductive routing for signals. Furthermore, the redistribution structure 114 may also provide structures such as integrated inductors or capacitors. In some embodiments, the insulating base layer 112 includes an organic material such as polybenzoxazole (PBO), polyimide (PI), one or more other suitable polymer materials, or a combination thereof. In those cases, the interposer substrate 110 is also referred to as an organic substrate or an organic interposer substrate. The dielectric layers may be formed by, e.g., a spin-coating process, although any suitable method may be used. After the first of the dielectric layers has been formed, openings (not shown) may be made through the first dielectric layer.

Once the first dielectric layer has been formed and patterned, the first of the conductive layers (such as copper layer) is formed over the first dielectric layer and through the openings in the first dielectric layer. In some embodiments, the first conductive layer is formed using a suitable formation process, such as electroplating, chemical vapor deposition (CVD) or sputtering. However, while the material and methods discussed are suitable to form the conductive layer, this material is merely exemplary. Any other suitable materials, such as aluminum, tungsten, nickel, titanium, gold, platinum, silver, another suitable material, or a combination thereof, and any other suitable processes of formation, such as CVD or physical vapor deposition (PVD), may be used to form the conductive layers.

Once the first conductive layer has been formed, a second dielectric layer and a second conductive layer may be formed by repeating steps that are similar to the steps for the first dielectric layer and first conductive layer. These steps may be repeated as desired in order to form an electrical connection between the conductive layers. In some embodiments, the deposition and patterning of the conductive layers and the dielectric layers may be continued until the redistribution structure 114 has the desired number of conductive layers, while the insulating base layer 112 has the desired number of dielectric layers.

The insulating protective layer 115 may be a single layer or a multi-layer structure. In some embodiments, the insulating protective layer 115 is a single layer and has openings exposing conductive layers of the redistribution structure 114. Bond pads (not shown) may be formed over the exposed redistribution structure 114. The insulating protective layer 115 is made of dielectric material(s) and provides stress relief for bonding stress incurred during subsequent bonding processes. For example, the insulating protective layer 115 may be made of a polymer material, such as polyimide, PBO, BCB, the like, or a combination thereof. Alternatively or additionally, the insulating protective layer 115 may include silicon oxide, silicon oxynitride, silicon nitride, silicon carbide, another suitable material, or a combination thereof.

Multiple deposition, coating, and/or etching processes may be used to form the interposer substrate 110 including the redistribution structure 114, the insulating base layer 112, and the insulating protective layer 115. In some embodiments, one or more thermal processes are performed during the formation the interposer substrate 110. For example, the insulating protective layer 115 may be made of a polymer material that is formed using a process involving a thermal operation.

After the interposer substrate 110 is provided, at least two semiconductor dies (e.g., the semiconductor dies 100S1 and 100S2) are removed from the carrier substrate 1000 and placed over the interconnect structure 110 using, for example, a pick and place tool (not shown) and then the bump structures 107 of the semiconductor dies 100S1 and 100S2 are mounted over the interposer substrate 110.

For example, two homogeneous dies (e.g., semiconductor dies 100S1 and 100S2) may be mounted over the die regions D1 and D2 of the interposer substrate 110, respectively, through the bump structures 107. The die regions D1 and D2 are separated from each other by a gap region G1 of the interposer substrate 110, so that the adjacent semiconductor dies 100S1 and 100S2 are also separated from one another by the gap region G1. In some embodiments, both of the semiconductor dies 100S1 and 100S2 are SoC dies or memory dies. Optional under bump metallization (UBM) layers (not shown) and the overlying solder bump structures (not shown) may be correspondingly formed below the bump structures 107 and over the interposer substrate 110 prior to the placement of the semiconductor dies 100S1 and 100S2.

Figure 1D:
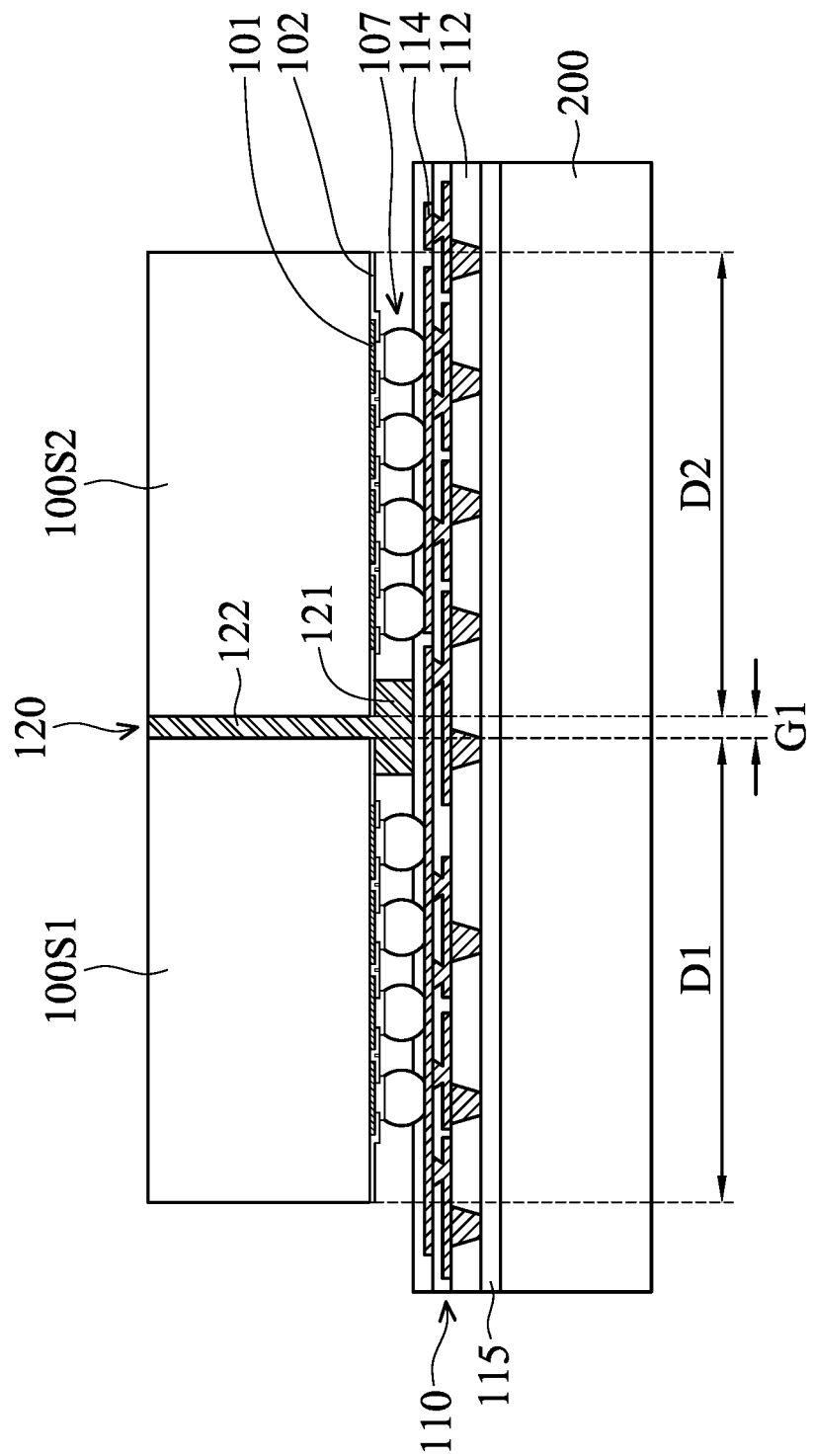
Figure 1E:
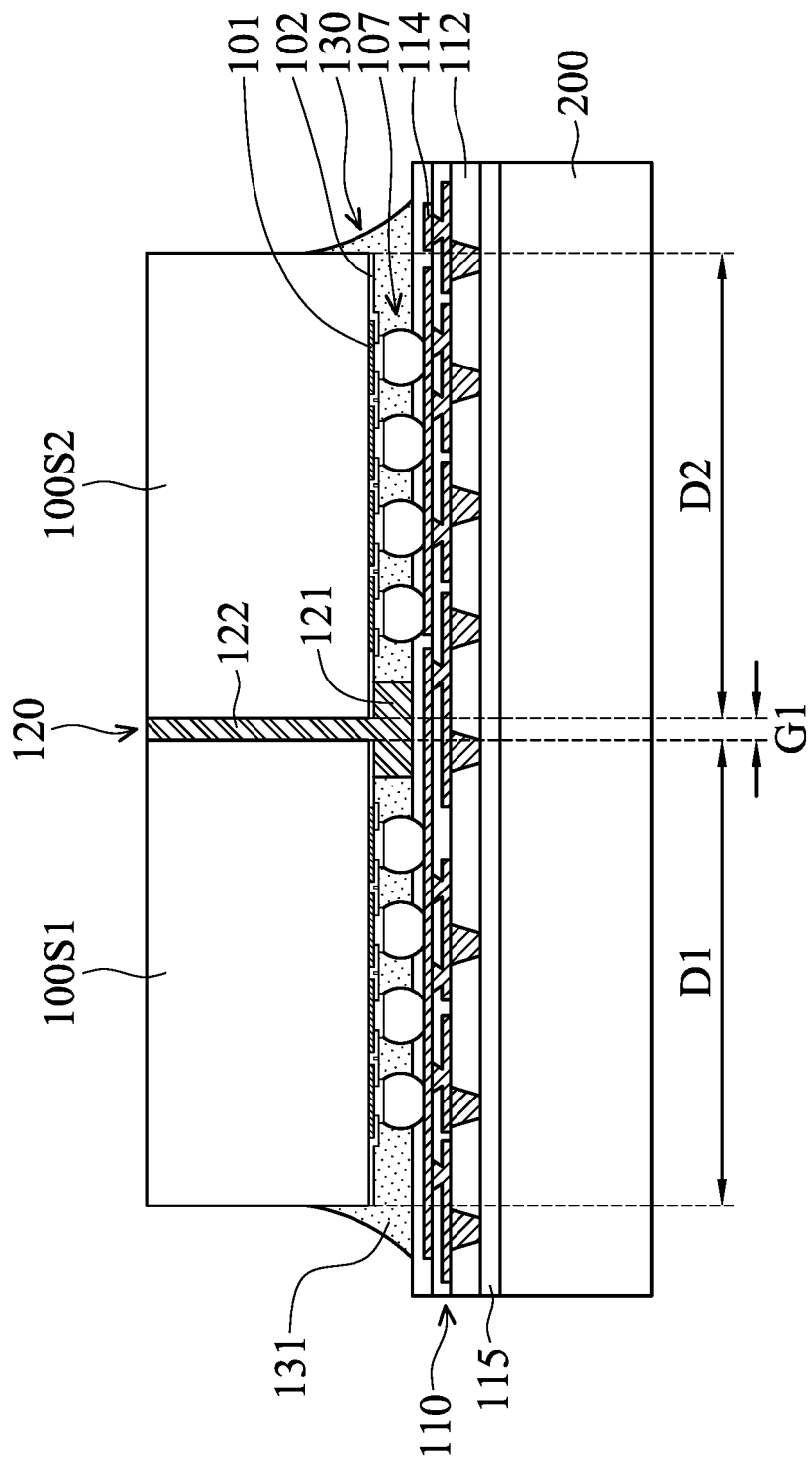
Figure 1F:
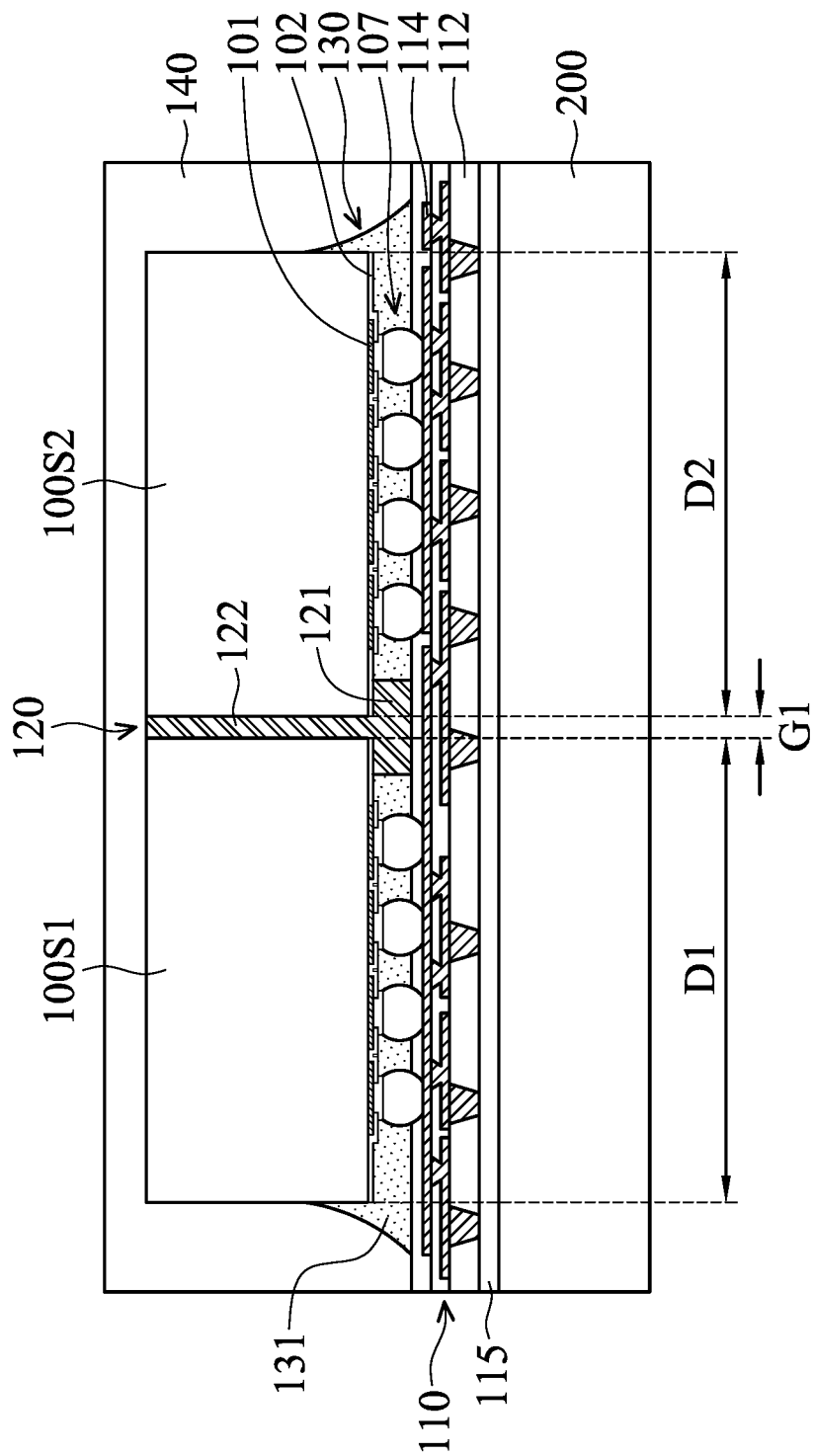
Figure 2A:
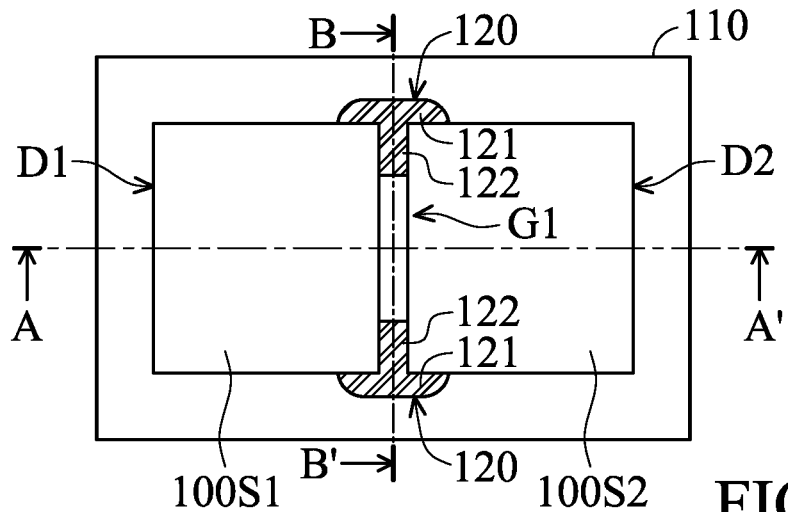
FIGS. 2A-2C are plan views of intermediate stages of the process shown in FIGS. 1A-1I, in accordance with some embodiments, in which FIGS. 1D-1F respectively show cross-sectional views along A-A' line shown in FIGS. 2A-2C.
Figure 2B:
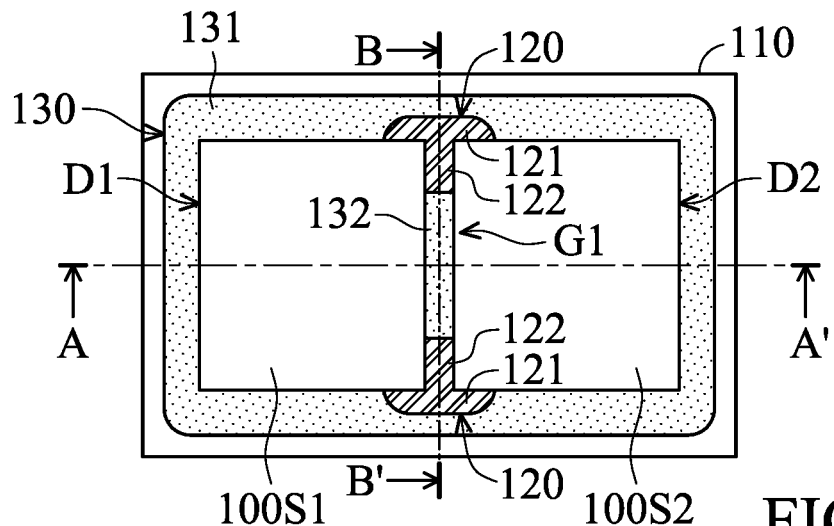
Figure 11:
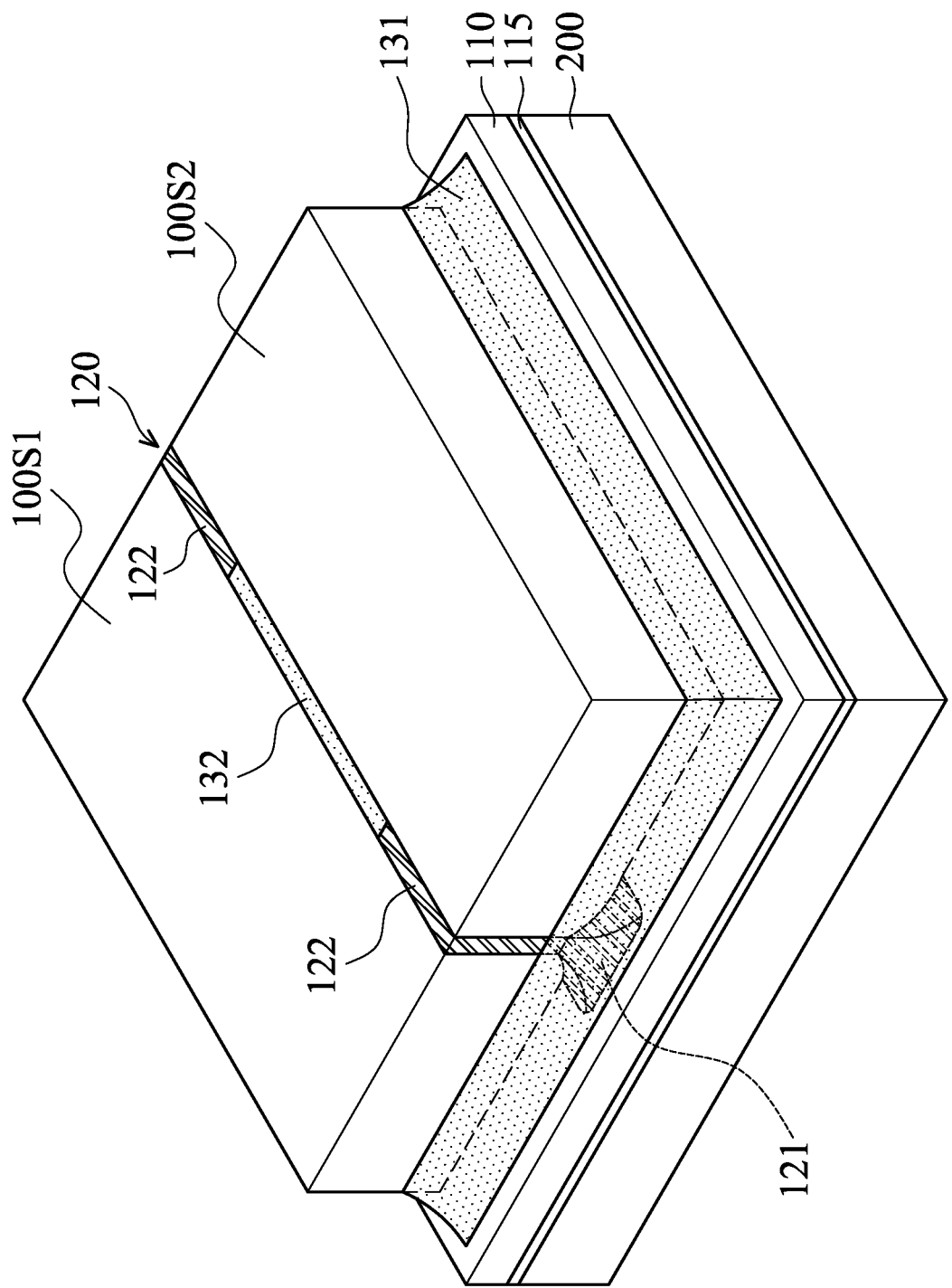
FIG. 11 is a simplified perspective diagram of a chip package structure shown in FIG. 1F, in accordance with some embodiments.

After the interposer substrate 110 is bonded with the semiconductor dies (e.g., the semiconductor dies 100S1 and 100S2), an insulating structure is formed over the interposer substrate 110 to separate adjacent semiconductor dies 100S1 and 100S2 from one another and fills the space/gap between the interposer substrate 110 and the semiconductor die 100S1 and the space/gap between the interposer substrate 110 and the semiconductor die 100S2, as shown in FIGS. 1D-1E, 2A-2B, 3A-3B, and 11 in accordance with some embodiments. FIGS. 2A-2B are plan views of intermediate stages of the process shown in FIGS. 1D-1E, in which FIGS. 1D-1E respectively show cross-sectional views along A-A' line shown in FIGS. 2A-2B. Furthermore, FIGS. 3A-3B respectively show cross-sectional views along B-B' line shown in FIGS. 2A-2B. In addition, FIG. 11 is a simplified perspective diagram of the chip package structure shown in FIG. 1F, in accordance with some embodiments. Some devices or features (e.g., the encapsulating layer 140) shown in FIG. 1E may be not shown in the chip package structure shown in FIG. 11 for the purpose of clarity.

Figure 3A:
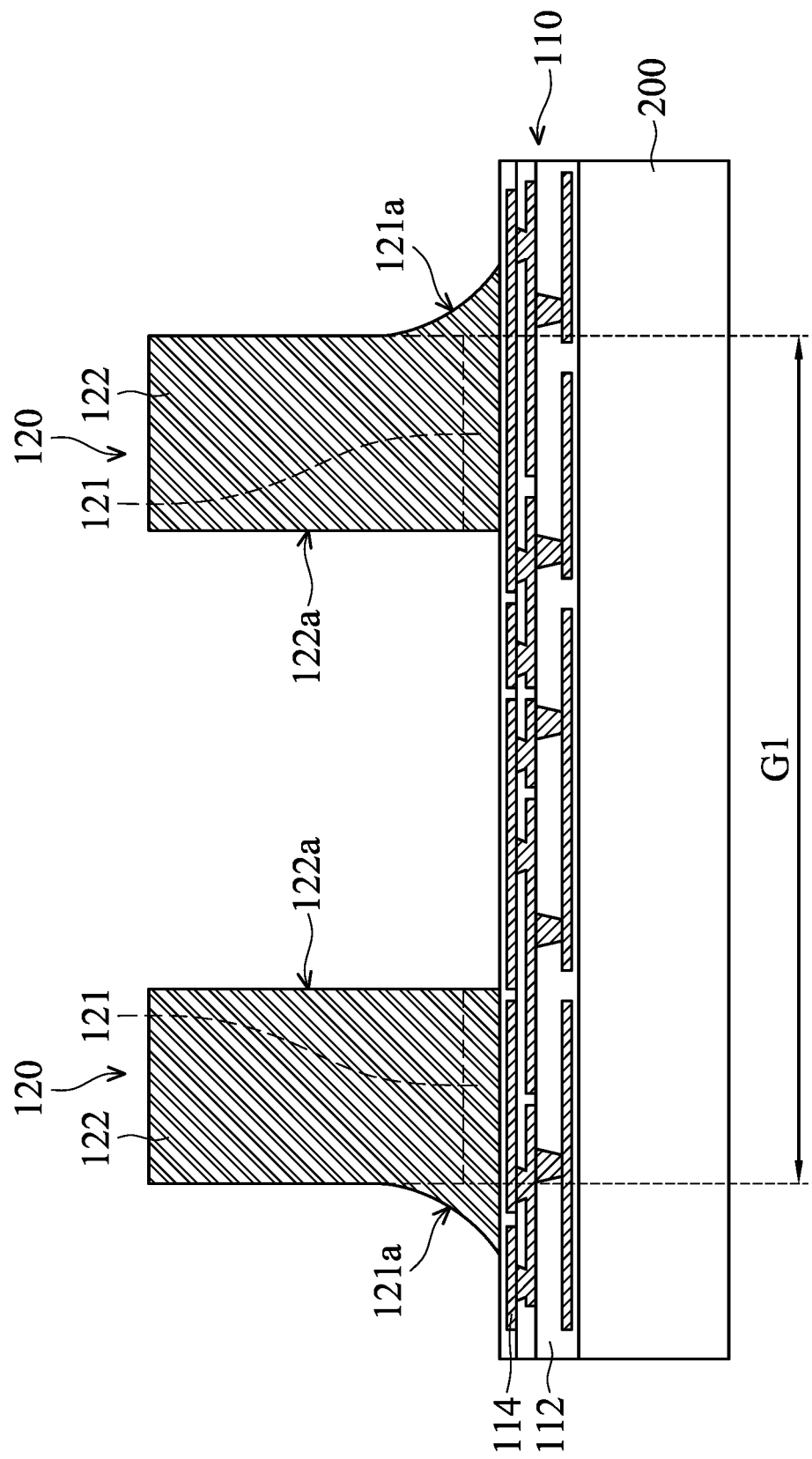
Figures 1, 3A:
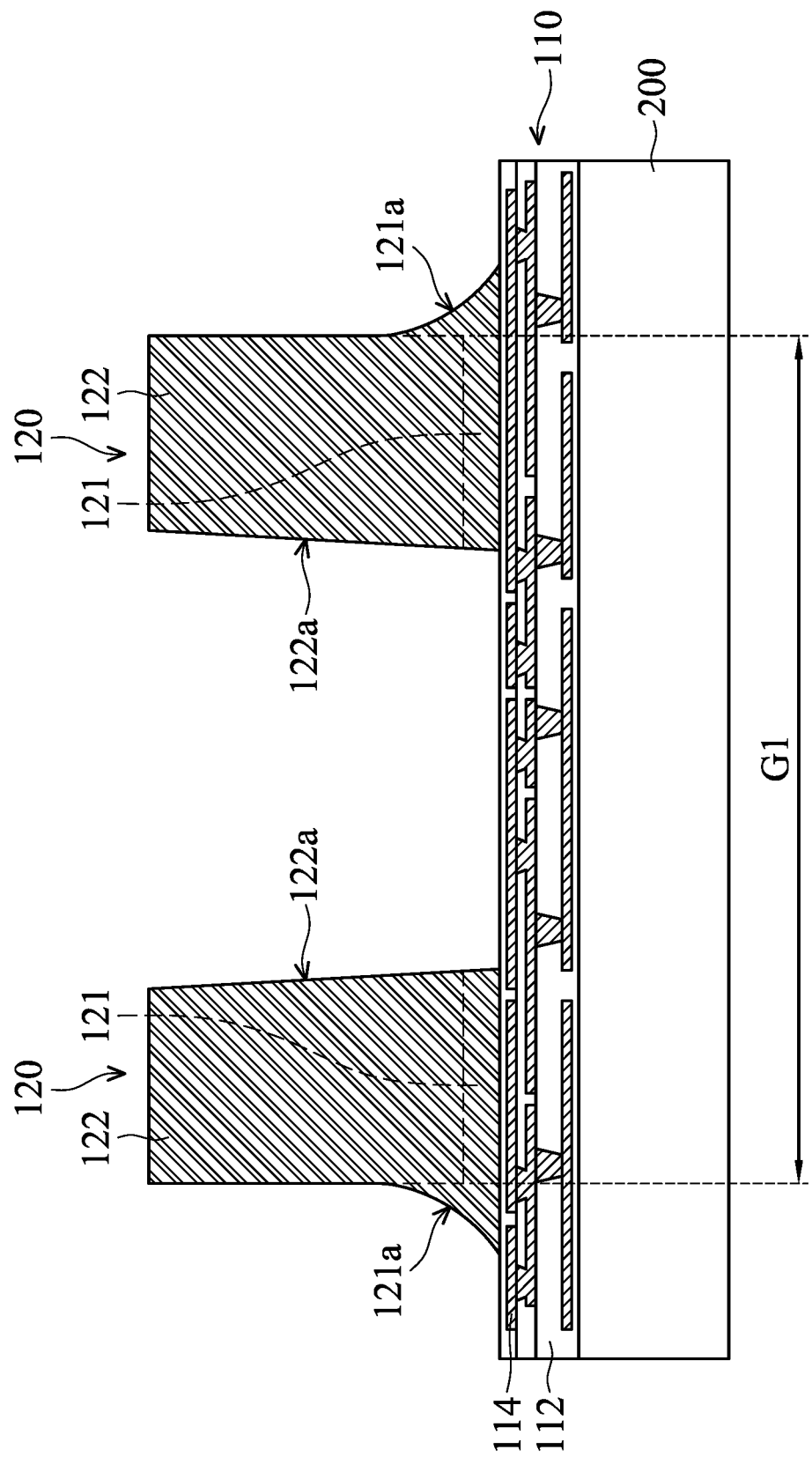
Figures 2, 3A:
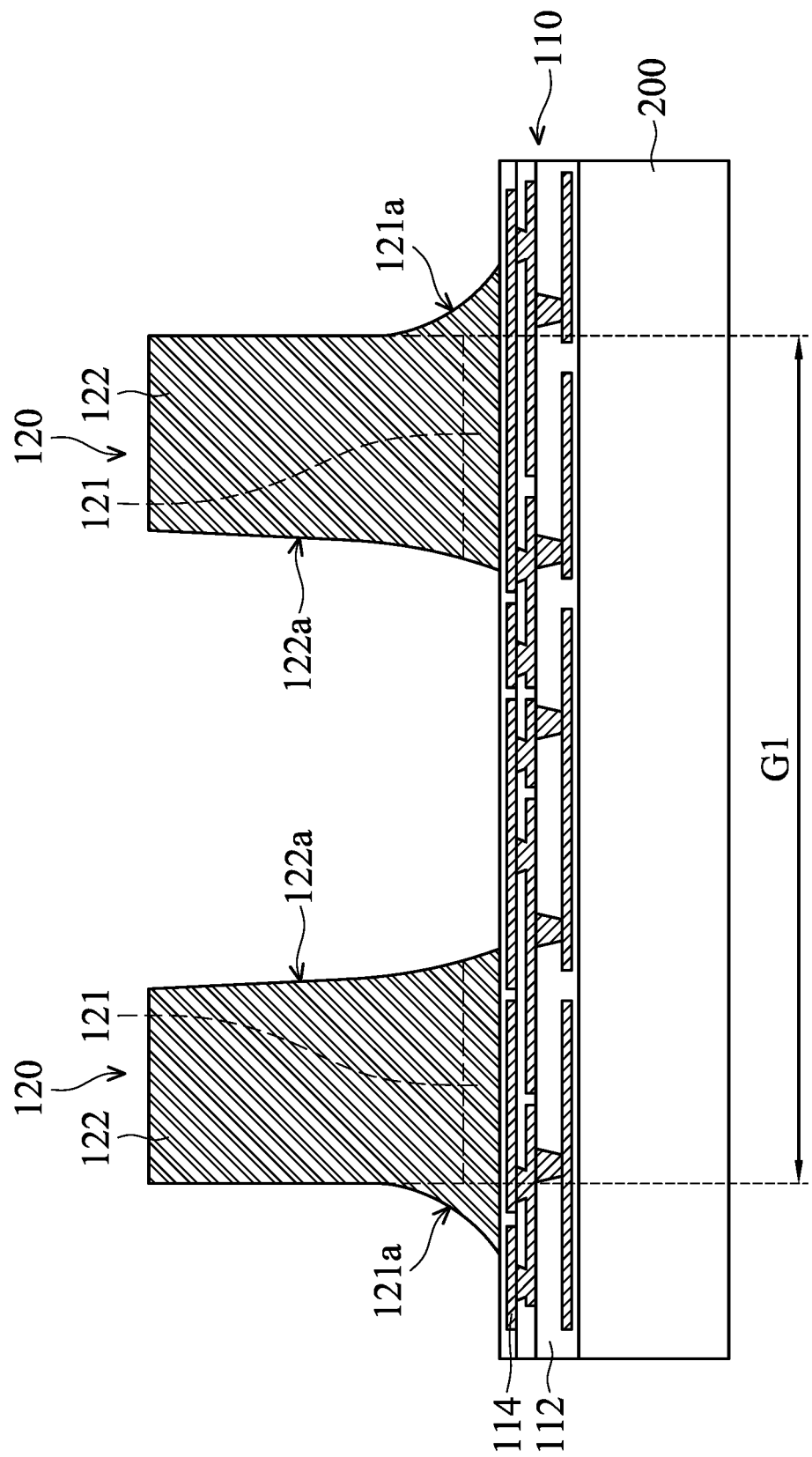
Figure 3B:
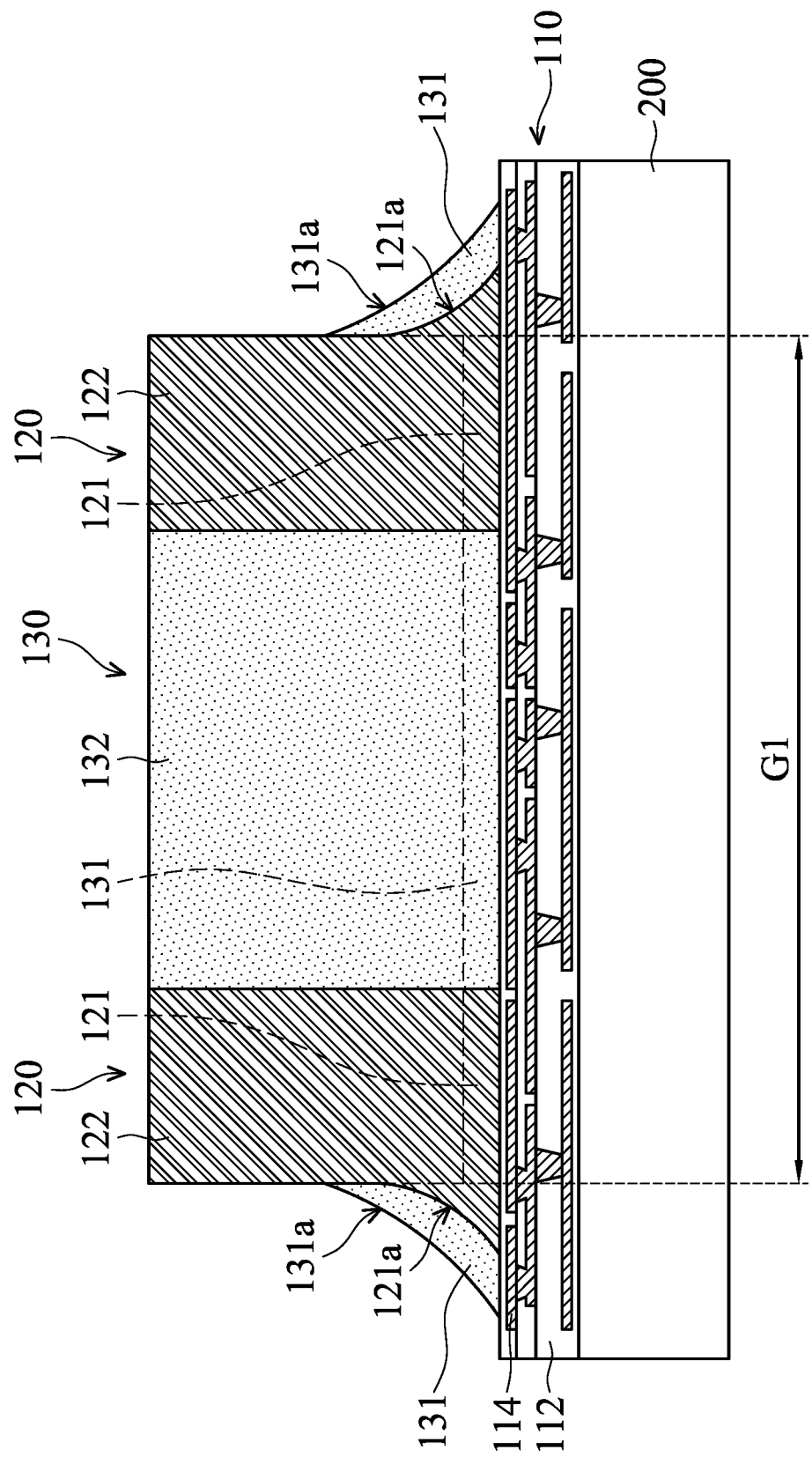

The insulating structure (which is also referred to as gap filling structure) is a multi-layer structure and includes insulating layers (or gap-filling layers) 120 formed over the gap region G1 of the interposer substrate 110 (as shown in FIGS. 1D, 2A and 3A), and an insulating layer 130 (or gap-filling layer) formed over the gap region G1 of the interposer substrate 110 and between the insulating layers 120 (as shown in FIGS. 1E, 2B and 3B), so that those insulating layers 120 are separated from each other. In some embodiments, as shown in FIG. 2A, the gap region G1 includes two ends and two insulating layers 120 are correspondingly adjacent to the ends of the gap region G1.

Each of the insulating layers 120 includes a first portion 121 and a second portion 122 extending from the first portion 121 along the sidewalls of the semiconductor die 100S1 and 100S2, as shown in FIGS. 1D and 3A. The first portion 121 of the insulating layer 120 is formed below the bottom surfaces of the first and second semiconductor dies 100S1 and S2 and laterally extends out of the edges of the first and second semiconductor dies 100S1 and S2 and the edges of the die regions D1 and D2 of the interposer substrate 100.

As shown in FIG. 2A, the portion of the first portion 121 within the gap region G1 of the interposer substrate 110 and the laterally extend portion of the first portion 121 are collectively formed a T-shaped contour as viewed from a top-view perspective. As shown in FIGS. 2A, 3A, and 11, the laterally extend portion of the first portion 121 forms an island-shaped protrusion with a slope or concave sidewall 121a and covers a portion of sidewalls of the first and second semiconductor dies 100S1 and S2. As shown in FIGS. 2A, 3A, and 11, the second portion 122 of the insulating layer 120 is formed from the bottom surfaces of the semiconductor dies 100S1 and 100S2 along and in direct contact with the sidewalls of the semiconductor die 100S1 and 100S2. In some embodiments, the second portion 122 of the insulating layer 120 is formed as a rectangular pillar having a substantially flat top surface and substantially vertical sidewall surfaces 122a, as shown in FIGS. 3A and 11. In some other embodiments, the second portion 122 of the insulating layer 120 is formed as a pillar having a substantially a flat top surface and a substantially slope sidewall surface 122a, as shown in FIGS. 3A-1. Alternatively, the second portion 122 of the insulating layer 120 is formed as a pillar having a substantially a flat top surface and a substantially concave sidewall surface 122a, as shown in FIGS. 3A-2.

In some embodiments, the insulating layer 130 also includes a first portion 131 and a second portion 132 extending from the first portion 131 along the sidewalls of the semiconductor die 100S1 and 100S2, as shown in FIGS. 1E, and 3B. In some embodiments, the insulating layer 130 is subsequently formed after the insulating layers 120 are formed. The first portion 131 of the insulating layer 130 fills the gaps formed between the first and second semiconductor dies 100S1 and S2 and the interposer substrate 110, so as to cover the die regions D1 and D2 and the gap region G1. Furthermore, the first portion 131 of the insulating layer 130 laterally extending out of the edges of the first and second semiconductor dies 100S1 and S2 and the edges of the die regions D1 and D2 of the interposer substrate 100 to surround (or wrap around) the first portion 121 of each insulting layer 120, as shown in FIG. 2B.

As shown in FIGS. 2B, 3B and 11, the laterally extend portion of the first portion 131 forms a ring to cover a portion of sidewalls of the first and second semiconductor dies 100S1 and S2 and the sidewall 121a of the first portion 121 of each insulating layer 120. The laterally extend portion of the first portion 131 has a height higher than that of the laterally extend portion of the first portion 121, so that the island-shaped protrusion formed by the laterally extend portion of the first portion 121 is fully covered by the laterally extend portion of the first portion 131. Similarly, the laterally extend portion of the first portion 131 forms a slope or concave sidewall 131a covers the sidewall 121a of the first portion 121 of each insulating layer 120. The second portion 132 of the insulating layer 130 is formed from the bottom surfaces of the semiconductor dies 100S1 and 100S2 along and in direct contact with the sidewalls of the semiconductor die 100S1 and 100S2 and the sidewalls 122a (shown in FIGS. 3A, 3A-1 and 3A-2) of the second portions 122 of the insulating layers 120, so that the second portion 132 of the insulating layer 130 is between the second portions 122 of the insulating layers 120. As a result, the second portion 132 of the insulating layer 130 has ends. Each of the ends of the second portion 132 of the insulating layer 130 is in direct contact with a corresponding first portion 122 of the insulating layer 120, as shown in FIG. 2B.

In some embodiments, the insulating layers 120 are made of a different underfill material than an underfill material layer of the insulating layer 130. In those cases, both of the insulating layers 120 and the insulating layer 130 are also referred to as underfill material layers. In those cases, the underfill material layers 120 and 130 are employed to protect and support the semiconductor dies 100S1 and 100S2 from operational and environmental degradation, such as stresses caused by the generation of heat during operation. The underfill material may be made of an epoxy-based resin or other protective material. In some embodiments, the formation of the underfill material layer involves an injecting process, a dispensing process, a film lamination process, one or more other applicable processes, or a combination thereof. In some embodiments, a thermal curing process is then used to cure the underfill material.

In some embodiments, the underfill material layer 130 also serves as a stable die bonding adhesive to enhance the adhesion between the semiconductor dies 100S1 and 100S2 and the interposer substrate 100. Furthermore, the underfill material layers 120 also serve as stress buffer layers between the underfill material layer 130 and the semiconductor dies 100S1 and 100S2, and between the underfill material layer 130 and the subsequently formed encapsulating layer. In some embodiments, the underfill material layers 120 have a number of different characteristics than the underfill material layer 130. More specifically, the underfill material layers 120 have a Young's modulus, a glass transition temperature ($T_g$), and a coefficient of thermal expansion (CTE) that are different than those of the underfill material layer 130. Specifically, the underfill material layers 120 have a greater Young's modulus and glass transition temperature ($T_g$) than those of the underfill material layer 130. Furthermore, the underfill material layers 120 have a lower coefficient of thermal expansion (CTE) than that of the underfill material layer 130. In some embodiments, the underfill material layers 120 have a glass transition temperature ($T_g$) in a range from about 50° C. to about 200° C. Moreover, the underfill material layers 120 have a Young's modulus in a range from about 2 GPa to about 10 GPa and a coefficient of thermal expansion (CTE) in a range from about 10 ppm/° C. to 50 ppm/° C. when the temperature of the underfill material layers 120 is lower than their glass transition temperature ($T_g$). In addition, the underfill material layers 120 have a Young's modulus in a range from about 0.1 GPa to about 1.5 GPa and a coefficient of thermal expansion (CTE) in a range from about 50 ppm/° C. to 200 ppm/° C. when the temperature of the underfill material layers 120 is higher than their glass transition temperature ($T_g$). As a result, the underfill material layers 120 can reduce die-to-die stress in the underfill material layer 130 due to CTE mismatch between the interposer substrate 100 and the subsequently formed package substrate. Therefore, the delamination between the semiconductor dies 100S1 and 100S2 and the underfill material layer 130 can be prevented, and the damage (e.g., crack) in the underfill material layer 130 can be reduced, thereby obtaining good, long-term reliability for the chip package structure.

In some embodiments, in order to effectively reduce such a die-to-die stress, the area of the underfill material layer 130 between the semiconductor dies 100S1 and 100S2 (i.e., the second portion 132 of the underfill material layer 130) is greater than the area of the underfill material layer 120 between the semiconductor dies 100S1 and 100S2 (i.e., the second portion 122 of the underfill material layer 120). Moreover, the total volume of the second portion 122 of the underfill material layers 120 is less than the volume of the second portion 132 of the underfill material layer 130. In some embodiments, the volume or area ratio of the second portion 122 of the underfill material layers 120 to the second portion 132 of the underfill material layer 130 and the second portion 122 of the underfill material layers 120 is in a range from about 10% to 50%. In some other embodiments, the volume or area ratio of the second portion 122 of the underfill material layers 120 to the second portion 132 of the underfill material layer 130 and the second portion 122 of the underfill material layers 120 is in a range from about 10% to 30%. The sufficient volume or area ratio is designed to effectively prevent the delamination and crack issues as mentioned above, while avoiding the gap filling difficulty of the underfill material layer 130 from being increased after formation of the underfill material layers 120.

Figure 2C:
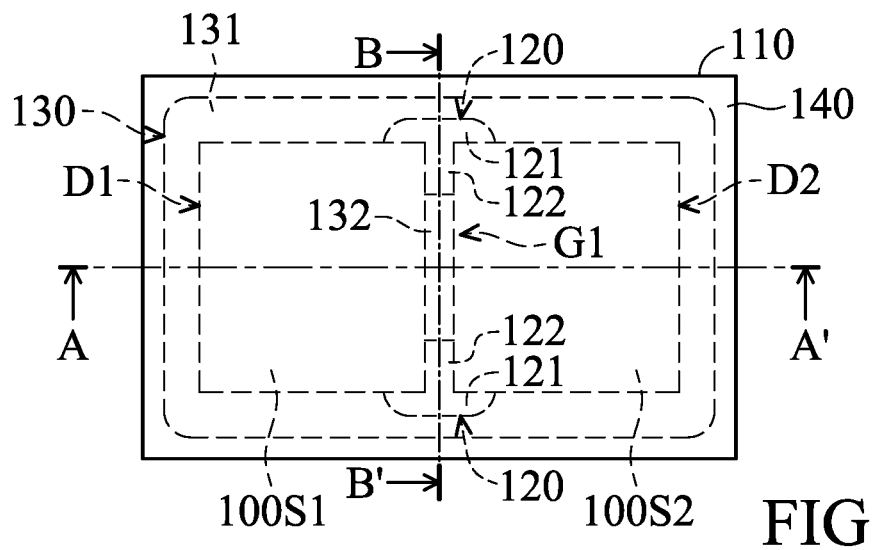

After the underfill material layers 120 and the underfill material layer 130 are formed, an encapsulating layer 140 (which is also referred to as package layer) is formed over the interposer substrate 110 to cover the semiconductor dies 100S1 and 100S2 and surround the semiconductor dies 100S1 and 100S2 and the underfill material layers 120 and 130, as shown in FIGS. 1F, 2C, and 3C in accordance with some embodiments. FIG. 2C is a plan view of the intermediate stage of the process shown in FIGS. 1F, in which FIG. 1F shows a cross-sectional view along A-A' line shown in FIG. 2C. Furthermore, FIG. 3C shows a cross-sectional view along B-B' line shown in FIG. 2C. As shown in FIG. 1F, the encapsulating layer 140 surrounds outer sidewalls of the semiconductor dies 100S1 and 100S2 and covers the top surfaces of the semiconductor dies 100S1 and 100S2 (i.e., the rear surfaces 100b (or non-active surfaces) of the semiconductor dies 100S1 and 100S2) and the underfill material layers 120 and 130.

As shown in FIGS. 2C and 3C, the portion of the encapsulating layer 140 that surrounds the outer sidewalls of the semiconductor dies 100S1 and 100S2 covers the sidewall 131a of the first portion 131 of the underfill material layer 130. That is, the first portion 121 of each underfill material layer 120 and the first portion 131 of the underfill material layer 130 are laterally extended below the encapsulating layer 140. This portion of the encapsulating layer 140 covering the sidewall 131a is also in contact an outer sidewall of the second portion 122 of each underfill material layer 120 above the sidewall 131a.

In some embodiments, the encapsulating layer 140 is made of a molding compound material. For example, a liquid molding compound material is applied over the interposer substrate 110, the semiconductor dies 100S1, and 100S2, and the underfill material layers 120 and 130. Afterwards, a thermal process is then applied to harden the liquid molding compound material. In those cases, the encapsulating layer 140 is referred to as a molding compound layer.

Figure 1G:
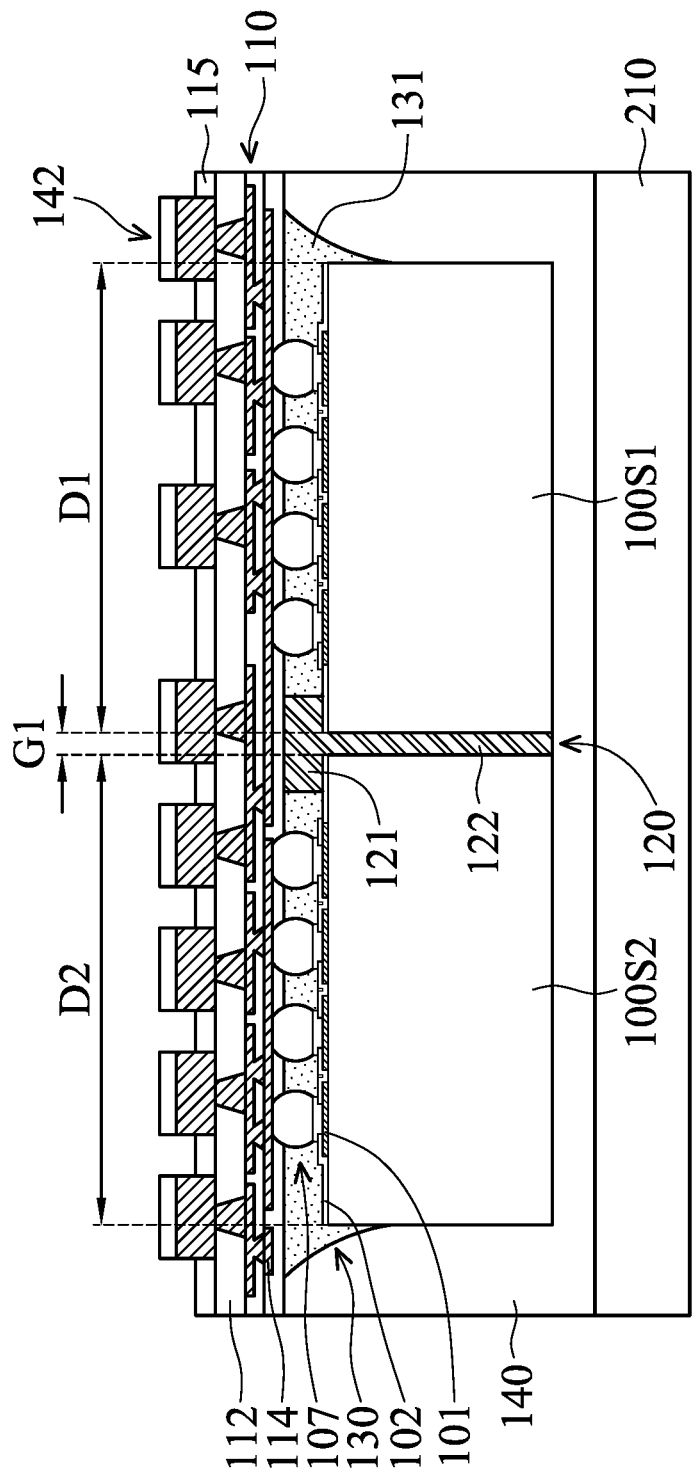

Afterwards, the carrier substrate 200 is removed and bump structures 142 (e.g., controlled collapse chip connection (C4) bumps) are formed in the passivation layer 115 of the interposer substrate 110, as shown in FIG. 1G in accordance with some embodiments. The carrier substrate 200 is de-bonded so as to separate the interposer substrate 110 and the overlying structure from the carrier substrate 200. In some embodiments, a de-bonding process includes projecting a light such as a laser light or a UV light on the de-bonding layer (e.g., the LTHC layer) on the carrier substrate 200, such that the carrier substrate 200 can be easily removed. In some embodiments, the de-bonding layer is further removed or peeled off.

Subsequently, the encapsulating layer 140 may be attached to a carrier substrate 210. Similarly, the carrier substrate 210 includes a de-bonding layer (not shown) coated thereon. The carrier substrate 210 may be a glass carrier substrate, a ceramic carrier substrate or any suitable carrier substrate. The de-bonding layer may include an LTHC layer or an adhesive layer (such as a ultra-violet curable adhesive or a heat curable adhesive layer).

After the removal of the carrier substrate 200 and the attachment of the carrier substrate 210, the bump structures 142 are formed in the openings of the insulating protective layer 115 that exposes bond pads (not shown) of the redistribution structure 114. In some embodiments, the bump structures 142 have a size that is greater than that of the bump structures 107. The bump structures 142 may include a material such as tin, silver, lead-free tin, or copper. The bump structures 142 serve as an electrical connection between the interposer substrate 110 and an external circuit (not shown). Optional under bump metallization (UBM) layers (not shown) may be correspondingly formed between the bond pads of the redistribution structure 114 and the bump structures 142.

Figure 1H:
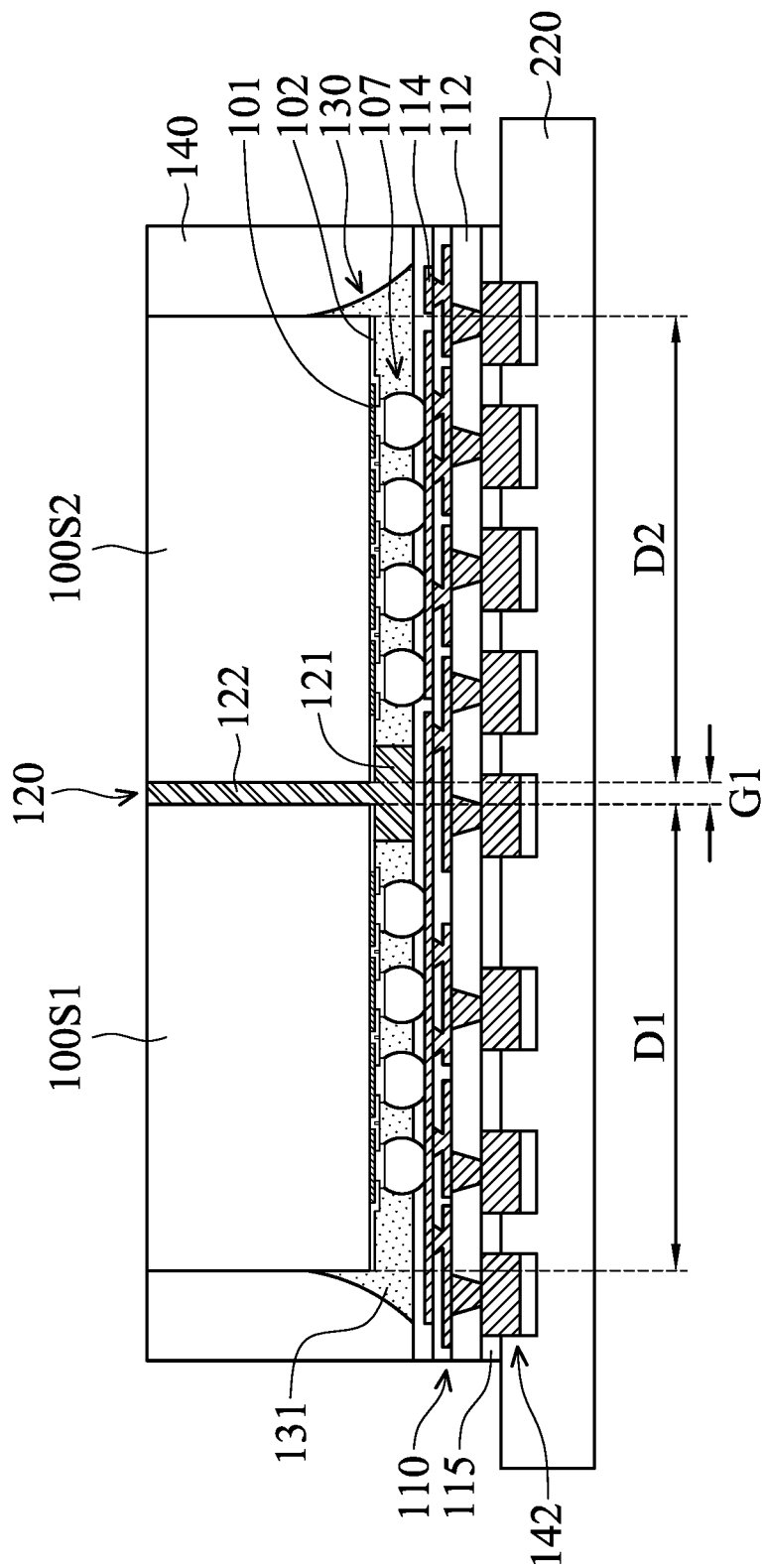
Figure 1I:
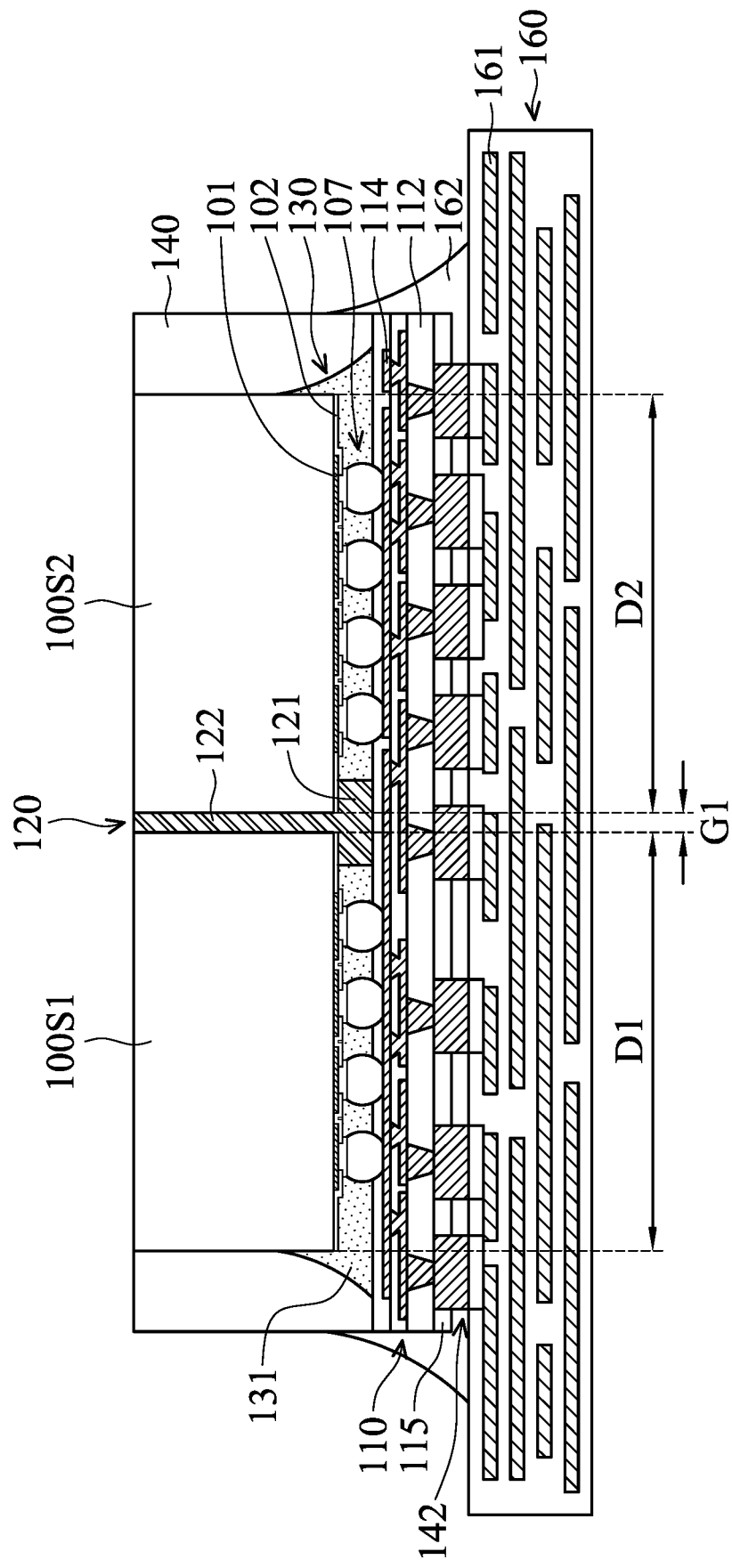

Afterwards, the carrier substrate 210 is removed to expose the top surface of the encapsulating layer 140, and an etch back process is performed on the exposed top surface of the encapsulating layer 140, as shown in FIG. 1H in accordance with some embodiments. More specifically, the bump structures 142 are attached to a tape layer 220 (e.g., back grinding tape layer). Afterwards, the encapsulating layer 140 is etched back to expose the top surfaces of the second portion 120 of the underfill material layers 120, the second portion 130 of the underfill material layer 130, and the semiconductor dies 100S1 and 100S2, in accordance with some embodiments. For example, a planarization process may be used to thin the encapsulating layer 140. The planarization process may include a grinding process, a chemical mechanical polishing (CMP) process, an etching process, another applicable process, or a combination thereof. As a result, the top surface of the encapsulating layer 140 is substantially level to the top surfaces of the second portion 120 of the underfill material layers 120, the second portion 130 of the underfill material layer 130, and the semiconductor dies 100S1 and 100S2.

Afterwards, the tape layer 220 is removed from the overlying structure, in accordance with some embodiments. The top surfaces of the encapsulating layer 140, the second portion 120 of the underfill material layers 120, the second portion 130 of the underfill material layer 130, and the semiconductor dies 100S1 and 100S2 are then attached to a tape layer (not shown), such as a dicing tape layer. Afterwards, the interposed substrate 110 and the encapsulating layer 140 are successively diced by a sawing process, an etching process, or a combination thereof, so as to form individual chip package structures.

After the sawing process and the removal of the dicing tape layer, the interposer substrate 110 is bonded with a circuit substrate 160, as shown in FIG. 1H in accordance with some embodiments. More specifically, the interposer substrate 110 is mounted or attached to the circuit substrate 160 (which is also referred to as a package substrate) via the bump structures 142. In some embodiments, the circuit substrate 160 includes metallization layers 161, vias (not shown), and contact pads (not shown). The contact pads may be distributed on two opposite sides of the circuit substrate 160, and exposed for electrically connecting with subsequently formed elements/features. In some embodiments, the metallization layers 161 and the vias are embedded in the circuit substrate 160 and together provide routing function for the circuit substrate 160.

Afterwards, an insulating layer 162 is formed to fill in the spaces/gaps between the circuit substrate 300 and the interposer substrate 110. The insulating layer 162 may be made of an underfill material, and therefore insulating layer 162 may be referred as to an underfill material layer. In some embodiments, the underfill material layer 162 fills up the spaces in between adjacent bump structures 142 and covers the bump structures 142. In some embodiments, the underfill material layer 162 covers and is in contact with the sidewalls and the bottom surface of the interposer substrate 110. In some other embodiments, the underfill material layer 162 further surrounds a portion of sidewalls of the encapsulating layer 140.

Figure 4:
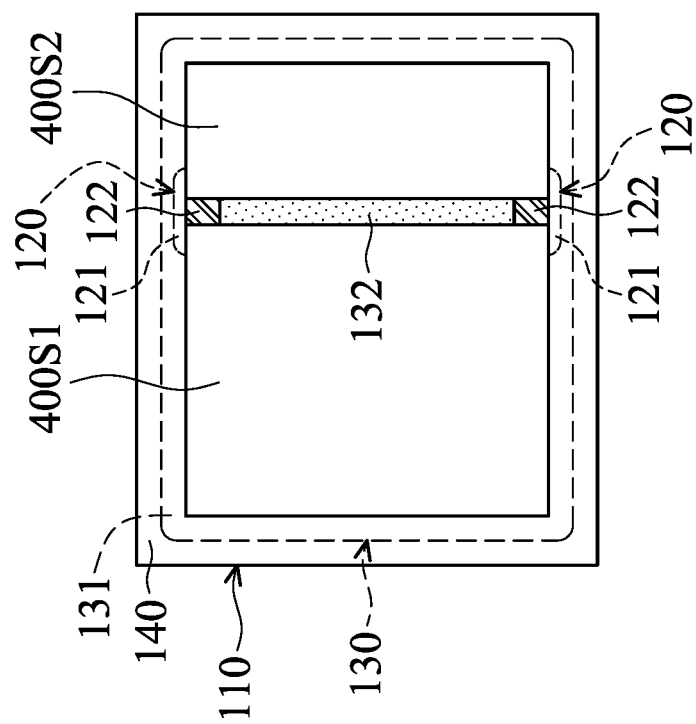
FIG. 4 is a plan view of an arrangement of semiconductor dies in a chip package structure, in accordance with some embodiments.

Many variations and/or modifications can be made to embodiments of the disclosure. For example, the chip package structure shown in FIG. 1I includes two homogeneous dies, but embodiments of the disclosure are not limited thereto. FIG. 4 shows a plan view of an arrangement of semiconductor dies in a chip package structure, in accordance with some embodiments. The chip package structure shown in FIG. 4 is similar to the chip package structure shown in FIG. 1I. For clarity and easy of description, the circuit substrate 160 and the underfill material layer 162 are not shown in FIG. 4. In some embodiments, the materials, formation methods, and/or benefits of the chip package structure shown in FIGS. 1A to 1I may also be applied in the embodiments illustrated in FIG. 4, and are therefore not repeated.

Unlike the chip package structure shown in FIG. 11, the chip package structure shown in FIG. 4 includes two heterogeneous semiconductor dies (e.g., semiconductor die 400S1 and 400S2). More specifically, the semiconductor die 400S1 is a SoC die, and the semiconductor die 400S2 is a memory die, such as a high-bandwidth memory (HBM) die. Alternatively, the semiconductor die 400S2 is a SoC die, and the semiconductor die 400S1 is a memory die (e.g., HBM die). Similar to the chip package structure shown in FIG. 1I, the second portion 132 of the underfill material layer 130 has an I-shaped contour, as viewed from a top-view perspective.

Many variations and/or modifications can be made to embodiments of the disclosure. For example, the chip package structure shown in FIG. 1I or 4 includes two homogeneous or heterogeneous semiconductor dies (e.g., the semiconductor dies 100S1 and 100S2 shown in FIG. 1I or the semiconductor dies 400S1 and 400S2 shown in FIG. 4) arranged side by side, but embodiments of the disclosure are not limited thereto. FIGS. 5 to 10 show plan views of various arrangements of more than two homogeneous or heterogeneous semiconductor dies in a chip package structure, in accordance with some embodiments. For clarity and easy of description, the circuit substrate 160 and the underfill material layer 162 are not shown in FIGS. 5 to 10. In some embodiments, the materials, formation methods, and/or benefits of the chip package structure shown in FIGS. 1A to 1I may also be applied in the embodiments illustrated in FIGS. 5 to 10, and are therefore not repeated.

Figure 5:
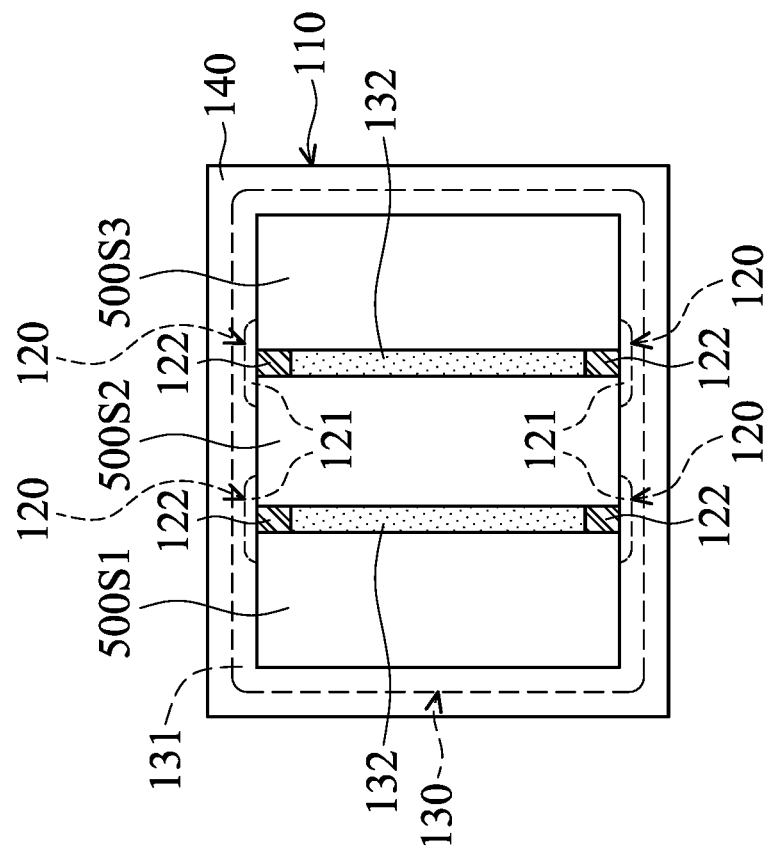
FIG. 5 is a plan view of an arrangement of semiconductor dies in a chip package structure, in accordance with some embodiments.

As shown in FIG. 5, the chip package structure includes three homogeneous or heterogeneous semiconductor dies (e.g., semiconductor dies 500S1 to 500S3) arranged in a row and adjacent to each other, in accordance with some embodiments. More specifically, at least one of the semiconductor dies 500S1 to 500S3 is a SoC die, and at least one of the semiconductor dies 500S1 to 500S3 is a memory die (e.g., HBM die). Unlike the chip package structure shown in FIG. 1I or 4, the second portion 132 of the underfill material layer 130 has an II-shaped contour, as viewed from a top-view perspective.

Similar to the chip package structure shown in FIG. 5, the chip package structure shown in FIG. 6 also includes three homogeneous or heterogeneous semiconductor dies (e.g., semiconductor dies 600S1 to 600S3), in accordance with some embodiments. However, unlike the chip package structure shown in FIG. 5, at least one of the semiconductor dies 600S1 to 600S3 has a different size than the others, in accordance with some embodiments. For example, the semiconductor die 600S1 may have a size greater than the size of the semiconductor dies 600S2 and 600S3. In some embodiments, the semiconductor dies 600S1 to 600S3 have an arrangement to make the second portion 132 of the underfill material layer 130 having a T-shaped contour, as viewed from a top-view perspective.

As shown in FIG. 7, the chip package structure includes four homogeneous or heterogeneous semiconductor dies (e.g., semiconductor dies 700S1 to 700S4), in accordance with some embodiments. Similar to the chip package structure shown in FIG. 6, at least one of the semiconductor dies 700S1 to 700S4 has a different size than the others, in accordance with some embodiments. For example, the semiconductor dies 700S1 and 700S2 may have the same size, and the semiconductor dies 700S3 and 700S4 may also have the same size. However, the size of the semiconductor dies 700S1 and 700S2 may be greater than the size of the semiconductor dies 700S3 and 700S4. Moreover, in some embodiments, the semiconductor dies 700S1 to 700S4 have an arrangement to make the second portion 132 of the underfill material layer 130 having an H-shaped contour, as viewed from a top-view perspective.

Figure 8:
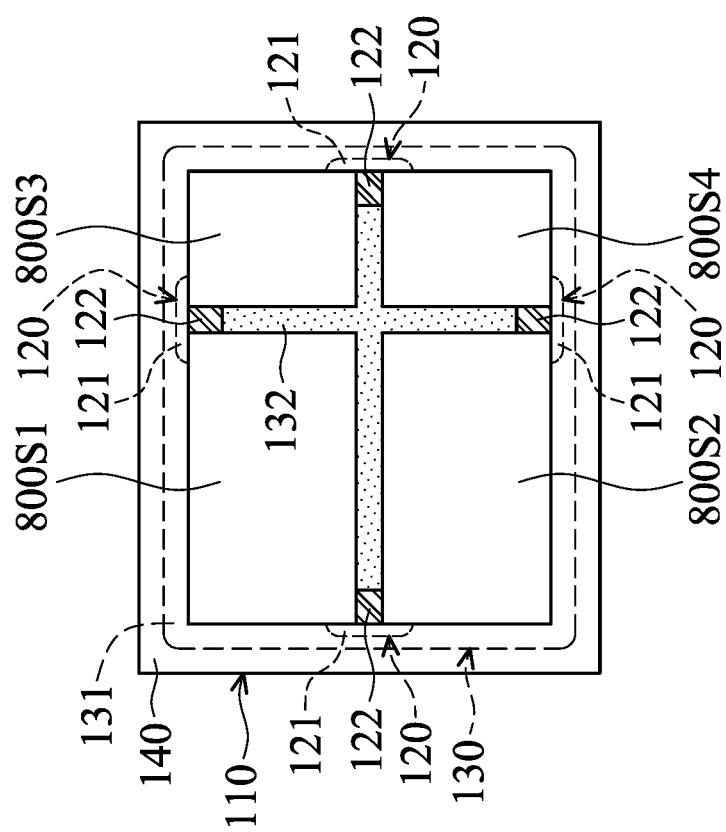
FIG. 8 is a plan view of an arrangement of semiconductor dies in a chip package structure, in accordance with some embodiments.

Similar to the chip package structure shown in FIG. 7, the chip package structure shown in FIG. 8 also includes four homogeneous or heterogeneous semiconductor dies (e.g., semiconductor dies 800S1 to 800S4), in accordance with some embodiments. Also, similar to the chip package structure shown in FIG. 7, at least one of the semiconductor dies 800S1 to 800S4 has a different size than the others, as shown in FIG. 8 in accordance with some embodiments. For example, the semiconductor dies 800S1 and 800S2 may have the same size, and the semiconductor dies 800S3 and 800S4 may also have the same size. However, the size of the semiconductor dies 800S1 and 800S2 may be greater than the size of the semiconductor dies 800S3 and 800S4. However, unlike the chip package structure shown in FIG. 7, the semiconductor dies 800S1 to 800S4 have an arrangement to make the second portion 132 of the underfill material layer 130 having a "+"-shaped contour, as viewed from a top-view perspective.

Figure 9:
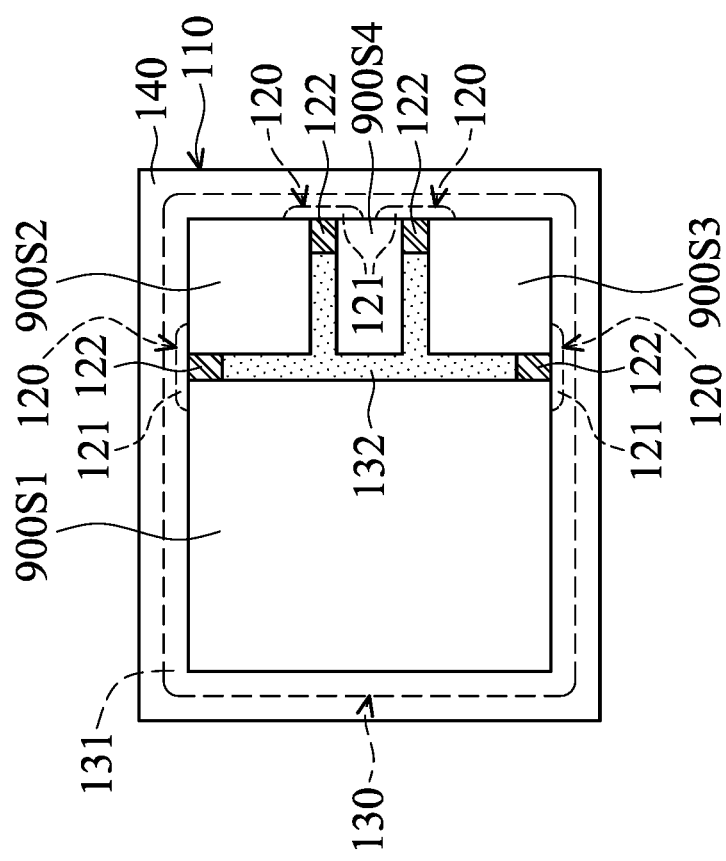
FIG. 9 is a plan view of an arrangement of semiconductor dies in a chip package structure, in accordance with some embodiments.

Similar to the chip package structure shown in FIG. 7 or 8, the chip package structure shown in FIG. 9 also include four homogeneous or heterogeneous semiconductor dies (e.g., semiconductor dies 900S1 to 900S4), in accordance with some embodiments. Also, similar to the chip package structure shown in FIG. 7 or 8, at least one of the semiconductor dies 900S1 to 900S4 has a different size than the others, as shown in FIG. 9 in accordance with some embodiments. For example, the size of the semiconductor die 900S1 may be greater than the size of the semiconductor dies 900S2 and 900S3. The size of the semiconductor dies 900S2 and 900S3 may be greater than the size of the semiconductor die 900S4. However, unlike the chip package structure shown in FIG. 7 or 8, the semiconductor dies 900S1 to 900S4 have an arrangement to make the second portion 132 of the underfill material layer 130 having a π-shaped contour, as viewed from a top-view perspective.

Figure 10:
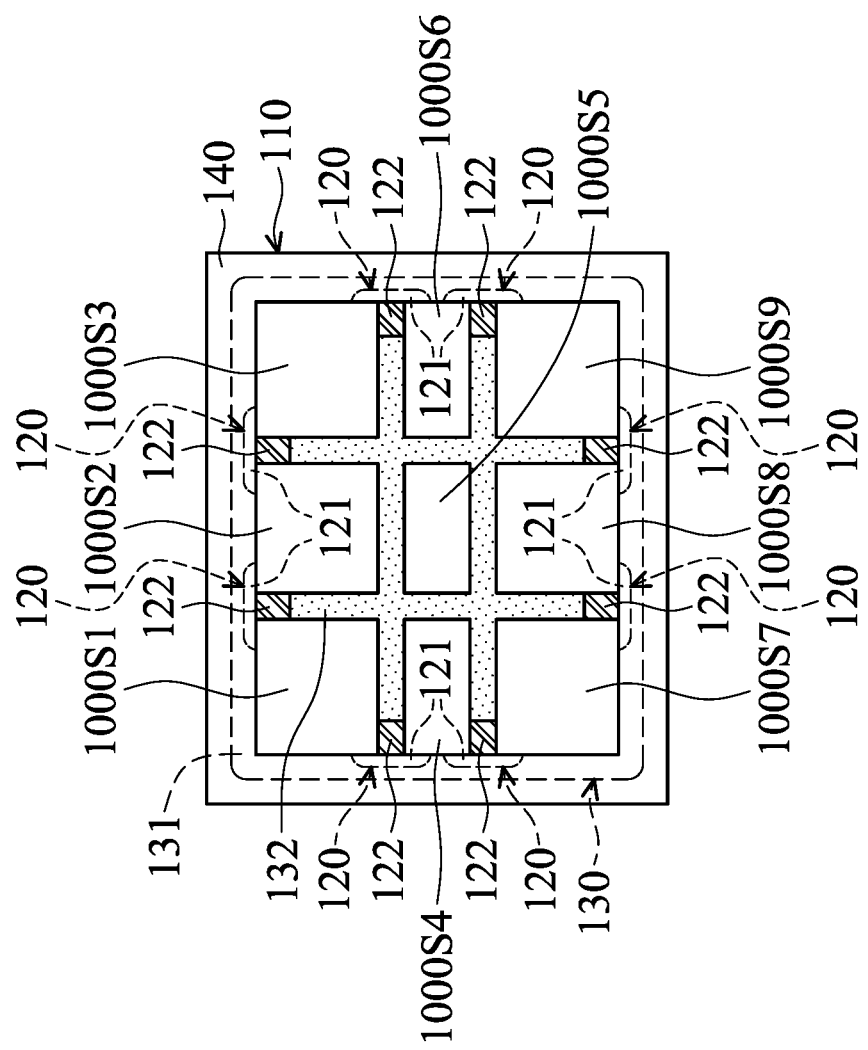
FIG. 10 is a plan view of an arrangement of semiconductor dies in a chip package structure, in accordance with some embodiments.

As shown in FIG. 10, the chip package structure includes nine homogeneous or heterogeneous semiconductor dies (e.g., semiconductor dies 1000S1 to 1000S9) arranged in an array, in accordance with some embodiments. In some embodiments, at least one of the semiconductor dies 1000S1 to 1000S9 has a different size than the others. For example, the semiconductor dies 1000S1 to 1000S3 and the semiconductor dies 1000S7 to 1000S9 may have the same size, and the semiconductor dies 1000S4 to 1000S6 may also have the same size. However, the size of the semiconductor dies 1000S1 to 1000S3 and 1000S7 to 1000S9 may be greater than the size of the semiconductor dies 1000S4 to 1000S6. Moreover, in some embodiments, the second portion 132 of the underfill material layer 130 having an "#"-shaped contour, as viewed from a top-view perspective.

Embodiments of the disclosure provide structures and formation methods of chip package structures. The chip package structure includes a first semiconductor die and an adjacent second semiconductor die arranged over a first die region and a second die region an interposer substrate, respectively. At least two gap-filling layers with different Young's modulus are formed between a gap between the first semiconductor die and the second semiconductor die. The gap-filling layer with relatively higher Young's modulus can protect the gap-filling layer with relatively lower Young's modulus from damage due to CTE mismatch between the interposer substrate and the subsequently formed package substrate. Therefore, the delamination between the first and second semiconductor dies and the gap-filling layer with relatively lower Young's modulus and/or the crack in the gap-filling layer with relatively lower Young's modulus can be prevented or mitigated, thereby obtaining good, long-term reliability for the chip package structure.

In accordance with some embodiments, a chip package structure is provided. The chip package structure includes an interposer substrate including a first die region and a second die region that are separated by a gap region. The chip package structure also includes a first semiconductor die and a second semiconductor die respectively arranged over the first die region and the second die region. The chip package structure further includes a first gap-filling layer and a second gap-filling layer formed over the gap region and separated from each other. In addition, the chip package structure includes a third gap-filling layer over the gap region and between the first gap-filling layer and the second gap-filling layer. The Young's modulus of the third gap-filling layer is less than the Young's modulus of the first gap-filling layer and the Young's modulus of the second gap-filling layer.

In accordance with some embodiments, a chip package structure is provided. The chip package structure includes an organic interposer substrate and semiconductor dies arranged over the organic interposer substrate. The chip package structure also includes an encapsulating layer formed over the organic interposer substrate and surrounding the semiconductor dies. The chip package further structure includes an insulating structure formed over the organic interposer substrate to separate adjacent semiconductor dies from one another. The insulating structure includes a first insulating layer having ends, and second insulating layers in direct contact with the ends of the first insulating layer, respectively, and surrounded by the encapsulating layer. In addition, the chip package structure includes a package substrate bonded with the organic interposer substrate. The chip package structure also includes a third insulating layer formed between the package substrate and the organic interposer substrate and surrounding the organic interposer substrate.

In accordance with some embodiments, a method for forming a chip package structure is provided. The method includes mounting a plurality of semiconductor dies over die regions of an interposer substrate. Adjacent die regions are separated from one another by a gap region of the interposer substrate, and the gap region has a plurality of ends. The method also includes forming first underfill material layers over the interposer substrate and adjacent to the ends of the gap region. The method further includes forming a second underfill material layer over the interposer substrate and corresponding to the gap region. The second underfill material layer is in direct contact with each of the first underfill material layers. The Young's modulus of the second underfill material layer is less than the Young's modulus of the first underfill material layers. In addition, the method includes forming an encapsulating layer over the interposer substrate to surround the semiconductor dies, the first underfill material layers, and the second underfill material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
   an interposer substrate comprising a first die region and a second die region that are separated by a gap region;
   a first semiconductor die and a second semiconductor die respectively arranged over the first die region and the second die region;
   a first gap-filling layer and a second gap-filling layer formed over the gap region and separated from each other; and
   a third gap-filling layer over the gap region and between the first gap-filling layer and the second gap-filling layer, wherein a Young's modulus of the third gap-filling layer is less than a Young's modulus of the first gap-filling layer and a Young's modulus of the second gap-filling layer, and wherein a coefficient of thermal expansion (CTE) of the third gap-filling layer is greater than a CTE of the first gap-filling layer and a CTE of the second gap-filling layer.

2. The chip package structure as claimed in claim 1, further comprising an encapsulating layer formed over the interposer substrate, wherein the encapsulating layer surrounds the first and second semiconductor dies and the first, second and third gap-filling layers.

3. The chip package structure as claimed in claim 2, further comprising:
   a fourth gap-filling layer below the encapsulating layer and laterally extending between bottom surfaces of the first and second semiconductor dies and the interposer substrate,
   wherein each of the first gap-filling layer and the second gap-filling layer comprises:
   a first portion below the bottom surfaces of the first and second semiconductor dies and laterally extending below the encapsulating layer; and
   a second portion extending from the first portion along sidewalls of the first and second semiconductor dies, and wherein the third gap-filling layer comprises:
a first portion between the first and second semiconductor dies and; and
a second portion extending from the first portion of the third gap-filling layer along sidewalls of the first and second semiconductor dies.

4. The chip package structure as claimed in claim 3, wherein the first portion of the first gap-filling layer is surrounded by the fourth gap-filling layer.

5. The chip package structure as claimed in claim 2, wherein the encapsulating layer is made of a molding compound material and the first, second, and third gap-filling layers are made of underfill materials.

6. The chip package structure as claimed in claim 1, wherein one of the first and second semiconductor dies is a system-on-chip (SoC) die, and the other is a memory die.

7. The chip package structure as claimed in claim 1, wherein the first and second semiconductor dies are system-on-chip (SoC) dies or memory dies.

8. The chip package structure as claimed in claim 1, wherein an area of the third gap-filling layer between the first semiconductor die and the second semiconductor die is greater than an area of the first or second gap-filling layer between the first semiconductor die and the second semiconductor die.

9. The chip package structure as claimed in claim 1, wherein each of the first gap-filling layer and the second gap-filling layer has a T-shaped contour as viewed from a top-view perspective.

10. A chip package structure, comprising:
an organic interposer substrate;
a plurality of semiconductor dies arranged over the organic interposer substrate;
an encapsulating layer formed over the organic interposer substrate and surrounding the plurality of semiconductor dies;
an insulating structure formed over the organic interposer substrate to separate adjacent semiconductor dies from one another, and comprising:
a first insulating layer having a plurality of ends, wherein each of the adjacent semiconductor dies has an inner sidewall that is in direct contact with first insulating layer; and
a plurality of second insulating layers correspondingly in direct contact with the plurality of ends of the first insulating layer, and surrounded by the encapsulating layer, wherein the first insulating layer and the plurality of second insulating layers extend from and are in direct contact with a top surface of the organic interposer substrate, and wherein a top surface of the first insulating layer is substantially level with a top surfaces of the plurality of second insulating layers;
a package substrate bonded with the organic interposer substrate; and
a third insulating layer formed between the package substrate and the organic interposer substrate and surrounding the organic interposer substrate.

11. The chip package structure as claimed in claim 10, wherein a Young's modulus of the plurality of second insulating layers is different from a Young's modulus of the first insulating layer and a Young's modulus of the third insulating layer, and wherein a coefficient of thermal expansion (CTE) of the plurality of second insulating layers is different from a CTE of the first insulating layer and a CTE of the third insulating layer.

12. The chip package structure as claimed in claim 10, wherein the encapsulating layer is made of a molding compound material, and wherein the first insulating layer, the plurality of second insulating layers, and the third insulating layer are made of underfill materials.

13. The chip package structure as claimed in claim 10, wherein the first insulating layer has an I, II, T, H, +, #, or π-shaped contour, or a combination thereof, as viewed from a top-view perspective.

14. The chip package structure as claimed in claim 10, wherein one of the plurality of semiconductor dies is a system-on-chip (SoC) die or a memory die.

15. The chip package structure as claimed in claim 10, wherein a total volume of the plurality of second insulating layers is less than a volume of the first insulating layer.

16. The chip package structure as claimed in claim 10, wherein the third insulating layer is extended to cover a sidewall surface of the organic interposer substrate.

17. A chip package structure, comprising:
a plurality of semiconductor dies arranged over an interposer substrate and separated from each other by at least one gap region of the interposer substrate, wherein the gap region has a first end and a second end;
a first gap-filling layer, comprising:
a first portion extending from the first end to the second end of the gap region along outer edges of the plurality of semiconductor dies; and
a second portion formed over the gap region of the interposer substrate, wherein the second portion of the first gap-filling layer has a third end adjacent to and spaced-apart from the first end of the gap region, and a fourth end adjacent to and spaced-apart from the second end of the gap region; and
a plurality of second gap-filling layers over the interposer substrate, wherein a first one of the plurality of second gap-filling layers extends form the first end of the gap region to the third end of the second portion of the first gap-filling layer, and a second one of the plurality of second gap-filling layers extends from the second end of the gap region to the fourth end of the second portion of the first gap-filling layer.

18. The chip package structure as claimed in claim 17, wherein the plurality of second gap-filling layers each comprises:
a first portion formed below a bottom surface of the plurality of semiconductor dies; and
a second portion extending from the first portion of the second gap-filling layer along sidewalls of the plurality of the semiconductor dies.

19. The chip package structure as claimed in claim 18, wherein the first portion of the second gap-filling layer has a T-shaped contour as viewed from a top-view perspective.

20. The chip package structure as claimed in claim 17, wherein the plurality of second gap-filling layers each has a portion that is in direct contact with sidewall surfaces of two adjacent semiconductor dies of the plurality of semiconductor dies and the first portion of the first gap-filling layer.

* * * * *